(12) United States Patent
Usuki et al.

(10) Patent No.: US 11,310,918 B2
(45) Date of Patent: *Apr. 19, 2022

(54) METHOD FOR PRODUCING PLATED COMPONENT, PLATED COMPONENT, CATALYTIC ACTIVITY INHIBITOR AND COMPOSITE MATERIAL FOR ELECTROLESS PLATING

(71) Applicant: MAXELL, LTD., Kyoto (JP)

(72) Inventors: Naoki Usuki, Mishima-gun (JP); Akiko Kito, Takatsuki (JP); Atsushi Yusa, Nagaokakyo (JP)

(73) Assignee: MAXELL, LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/228,897

(22) Filed: Apr. 13, 2021

(65) Prior Publication Data

US 2021/0235587 A1    Jul. 29, 2021

Related U.S. Application Data

(60) Division of application No. 16/122,404, filed on Sep. 5, 2018, now Pat. No. 11,013,125, which is a (Continued)

(30) Foreign Application Priority Data

Mar. 11, 2016 (JP) .............................. JP2016-048586

(51) Int. Cl.
*C23C 18/16* (2006.01)
*C23C 18/20* (2006.01)
(Continued)

(52) U.S. Cl.
CPC .......... *H05K 3/182* (2013.01); *C08G 83/003* (2013.01); *C08L 33/26* (2013.01); *C08L 81/02* (2013.01);
(Continued)

(58) Field of Classification Search
CPC ........ H05K 3/182; H05K 3/18; H05K 3/4661; H05K 3/184; C08G 83/003; C08L 33/26;
(Continued)

(56) References Cited

U.S. PATENT DOCUMENTS

2003/0155248 A1* 8/2003 Dalman ................... C25D 5/02
205/158
2004/0241422 A1 12/2004 Naundorf et al.
(Continued)

FOREIGN PATENT DOCUMENTS

EP    0 187 962 A2    7/1986
EP    1274288 A1    1/2003
(Continued)

OTHER PUBLICATIONS

Apr. 11, 2017 International Search Report issued in International Patent Application No. PCT/JP2017/005177.
(Continued)

*Primary Examiner* — Dah-Wei D. Yuan
*Assistant Examiner* — Nga Leung V Law
(74) *Attorney, Agent, or Firm* — Oliff PLC

(57) ABSTRACT

A method for producing a plated part, includes: forming, on a surface of a base member, a catalyst activity inhibiting layer containing a polymer which has at least one of an amide group and an amino group; irradiating with light or heating a part of the surface of the base member on which the catalyst activity inhibiting layer is formed; applying an electroless plating catalyst to the surface of the base member heated or irradiated with the light; and bringing an electroless plating solution into contact with the surface of the base member to which the electroless plating catalyst is applied, to form an electroless plating film at a light-irradiated portion or a heated portion of the surface.

12 Claims, 2 Drawing Sheets

Related U.S. Application Data continuation of application No. PCT/JP2017/005177, filed on Feb. 13, 2017.

(51) Int. Cl.
| | |
|---|---|
| *C23C 18/38* | (2006.01) |
| *C23C 18/28* | (2006.01) |
| *H05K 3/18* | (2006.01) |
| *C08G 83/00* | (2006.01) |
| *C08L 33/26* | (2006.01) |
| *C08L 81/02* | (2006.01) |
| *H05K 3/46* | (2006.01) |

(52) U.S. Cl.
CPC ...... *C23C 18/1608* (2013.01); *C23C 18/1612* (2013.01); *C23C 18/1644* (2013.01); *C23C 18/204* (2013.01); *C23C 18/2066* (2013.01); *C23C 18/285* (2013.01); *C23C 18/38* (2013.01); *H05K 3/18* (2013.01); *H05K 3/4661* (2013.01); *C08L 2203/20* (2013.01)

(58) Field of Classification Search
CPC .. C08L 81/02; C08L 2203/20; C23C 18/1608; C23C 18/1612; C23C 18/1644; C23C 18/204; C23C 18/2066; C23C 18/285; C23C 18/38; C23C 18/1646; C23C 18/1657; C23C 18/30; C23C 18/32; C23C 18/1605; C23C 18/1868; C23C 18/1889; C23C 18/1893; C23C 18/208; C23C 18/2086

See application file for complete search history.

(56) References Cited

U.S. PATENT DOCUMENTS

| | | |
|---|---|---|
| 2009/0023011 A1 | 1/2009 | Chaffins et al. |
| 2012/0285736 A1* | 11/2012 | Yoshioka ............... H05K 3/184 |
| | | 174/262 |

FOREIGN PATENT DOCUMENTS

| | | |
|---|---|---|
| JP | 3222660 B2 | 10/2001 |
| JP | 2003-292615 A | 10/2003 |
| JP | 2010-021190 A | 1/2010 |
| JP | 2012-136769 A | 7/2012 |
| WO | 2009/075213 A1 | 6/2009 |
| WO | WO-2009075213 A1 * | 6/2009 ............. H05K 3/182 |

OTHER PUBLICATIONS

Wolfgang John, "3D components cut product costs"; Industrial Laser Solutions Japan; Sep. 2011; pp. 18-22.
Apr. 11, 2017 Written Opinion issued in International Patent Application No. PCT/JP2017/005177.
Oct. 7, 2019 Office Action issued in U.S. Appl. No. 16/122,404.
Oct. 1, 2019 Extended Search Report issued in European Patent Application No. 17762813.8.
Mar. 19, 2020 Notice of Allowance issued in U.S. Appl. No. 16/122,404.
Sep. 24, 2020 Office Action issued in European Patent Application No. 17762813.8.

* cited by examiner

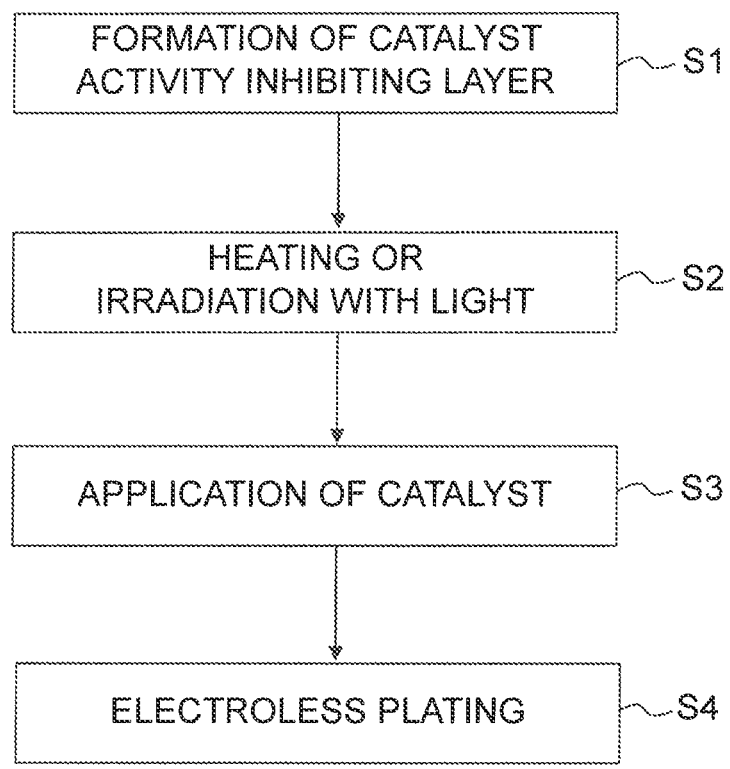

METHOD FOR PRODUCING PLATED COMPONENT, PLATED COMPONENT, CATALYTIC ACTIVITY INHIBITOR AND COMPOSITE MATERIAL FOR ELECTROLESS PLATING

CROSS REFERENCE TO RERATED APPLICATION

This application is a divisional application of U.S. application Ser. No. 16/122,404 filed Sep. 5, 2018, which in turn is a continuation application of International Application No. PCT/JP2017/005177 filed Feb. 13, 2017 and claiming convention priority of Japanese Patent Application No. 2016-048586 filed Mar. 11, 2016.

BACKGROUND OF THE INVENTION

Field of the Invention

The present invention relates to a method for producing a plated part (plated component) on which a plating film is selectively formed, the plated part (plated component), and a catalytic activity inhibitor.

Description of the Related Art

In recent years, a three-dimensional circuit formed part, in which an electric circuit is formed on a surface of an injection-molded product or the like, is referred to as MID (Molded Interconnect Device), and its application range is rapidly expanded. In the case of MID, it is possible to form the circuit on the surface of the molded product having a small size and a complicated shape. Therefore, MID is in consistency with the trend of compactization (miniaturization) of electronic parts. For example, a small-sized part, in which an antenna or the like is formed on a surface of a casing of a smartphone, is mass-produced in China. Further, the application of MID to sensors and lighting parts is also actively investigated in the field of automobile principally in Europe. Further, at present, a large amount of cable harness (wire harness) is used for the automobile. If the cable harness is replaced with MID, it is thereby possible to expect the decrease in the cost by realizing a light weight and reducing the number of assembling steps.

A method explained below is suggested, for example, as a method for forming a wiring pattern (electric circuit) on a surface of an insulating base member such as a resin molded product or the like. At first, a metal layer is formed on the entire surface of the base member. Subsequently, the formed metal layer is subjected to the patterning with a photoresist, and then the metal layer of a portion other than the wiring pattern is removed by means of the etching. Accordingly, the wiring pattern can be formed by the metal layer allowed to remain on the surface of the base member.

Further, a method, in which a laser beam is used, is suggested as a method for forming a wiring pattern (electric circuit) without using any photoresist (for example, Patent Document 1: Japanese Patent No. 3222660). At first, a laser beam is radiated onto a portion at which it is intended to form the wiring pattern, and thus the base member is roughened. Then, when an electroless plating catalyst is applied to the whole of the base member, the electroless plating catalyst strongly adheres to the portion irradiated with the laser beam as compared with the other portions. Subsequently, when the base member is washed, then the electroless plating catalyst remains at only the portion irradiated with the laser beam, and the catalyst having been present at the other portions can be removed with ease. The electroless plating is applied to the base member on which the electroless plating catalyst adheres to only the portion irradiated with the laser beam, and thus a plating film can be formed on only the portion irradiated with the laser beam, i.e., on only the predetermined wiring pattern. In the case of the method for forming the wiring pattern based on the use of the laser beam, it is possible to omit the labor and the cost for producing a photomask or the like, and hence it is easy to change the wiring pattern.

An LDS (Laser Direct Structuring) method is practically applied as another method for forming a wiring pattern (electric circuit) (for example, Non-Patent Document 1: Wolfgang John, "Three-dimensional components for reducing production cost", Industrial Laser Solutions Japan, e. x. press, September 2011, p. 18-22; and Patent Document 2: European Patent No. 1274288). In the case of the LDS method, a copper complex is kneaded into a thermoplastic resin to perform the injection molding, and the laser drawing is performed on a surface of a molded product containing the copper complex. The copper complex is converted into the metal by being irradiated with the laser beam, the catalytic activity of the electroless copper plating is expressed, and it is possible to plate the portion subjected to the laser drawing. The LDS method makes it possible to produce a three-dimensional circuit formed part (MID) in which a circuit is formed on a surface of an injection-molded product having a complicated shape. The LDS method comes into widespread use in the production of smartphones and automobiles.

A method, which is different from the method for kneading the catalyst into the molded product like the LDS method, is also suggested (for example, Patent Document 3: Japanese Patent Application Laid-open No. 2012-136769). Patent Document 3 discloses a method in which a functional group is applied to a surface of a molded product by using a femto-second laser beam having a short wavelength. The surface of the molded product has a polar group, and hence the chemical adhesion strength is expressed with respect to the plating film.

However, in the case of the method for forming the wiring pattern (electric circuit) by utilizing the laser beam as suggested in Patent Document 1, the electroless plating catalyst strongly adheres to the portions other than the portion irradiated with the laser beam depending on the type and the surface state of the base member, and the electroless plating catalyst cannot be removed even by performing the washing in some cases. For example, the electroless plating catalyst easily adheres to, for example, a base member which contains a filler that easily causes the adhesion of the electroless plating catalyst, a base member which has a large surface roughness, and a base member which has any void. Therefore, the electroless plating catalyst easily remains thereon even when the washing is performed. Further, the electroless plating catalyst permeates into the inside of the base member in some cases depending on the type of the electroless plating catalyst and the type of the base member. It has been difficult to remove the electroless plating catalyst having permeated into the base member by means of the washing. Then, if the electroless plating is applied to the base member in which the electroless plating catalyst remains at the portions other than the predetermined wiring pattern as described above, then an electroless plating film is generated at the portions other than the wiring pattern as a matter of course, and any problem arises.

Further, in the case of the LDS method, it is necessary to develop an exclusively usable resin. A problem arises such that the cost of the resin material is greatly increased. Then, the resin is colored due to the kneading of the large amount of the copper complex into the resin, and hence it has been difficult to apply the LDS method to transparent resins. Further, when the LDS method is applied, for example, to a sheet-shaped thin-walled molded product, it has been difficult to mass-produce a variety of products in small amounts, because it is necessary to use exclusively usable resins. Further, if it is intended to apply the LDS method to the production of a large-sized part such as a substitute or replacement part for the cable harness of the automobile or the like, the following problem arises. At first, the amount of the exclusively usable resin material to be consumed is increased, and hence the cost is raised. Then, it is necessary to realize a large-sized laser apparatus, which causes a problem in relation to the mass production. Further, the wiring patterns are adjacent to one another on an identical substrate, and hence it is also feared that the insulation performance can not be secured between the wiring patterns.

On the other hand, in Patent Document 3, it is investigated that the molded product surface is selectively plated without using any special resin material. However, it is difficult to provide any distinct contrast for the surface characteristic of the molded product between the drawn portion and the other portions by means of only the laser drawing. It is considered to be difficult to stably perform the selective plating by means of the method of Patent Document 3. Further, the method of Patent Document 3 requires an expensive short wavelength laser machining machine. This fact prohibits the widespread use of the method.

The present teaching solves the problems as described above, which provides a method for producing a plated part wherein the method hardly depends on the type, the shape, and the state of a base member, the method inhibits the formation or generation of any electroless plating film at portions other than a predefined pattern in accordance with a simple and easy production process, and the electroless plating film can be formed at only the predefined pattern.

SUMMARY OF THE INVENTION

According to a first aspect of the present teaching, there is provided a method for producing a plated part, including: forming, on a surface of a base member, a catalyst activity inhibiting layer (catalytic activity inhibiting layer) containing a polymer which has at least one of an amide group and an amino group; irradiating with light or heating a part of the surface of the base member on which the catalyst activity inhibiting layer is formed; applying an electroless plating catalyst to the surface of the base member heated or irradiated with the light; and bringing an electroless plating solution into contact with the surface of the base member to which the electroless plating catalyst is applied, to form an electroless plating film at a light-irradiated portion or a heated portion of the surface.

In this aspect, the polymer may be a branched polymer having a side chain. Further, the method for producing the plated part may further include washing the surface of the base member after the part of the surface of the base member is heated or irradiated with the light and before the electroless plating solution is brought into contact with the surface of the base member.

The branched polymer may be a dendritic polymer or a hyper-branched polymer. Further, the branched polymer may have a number average molecular weight of 3,000 to 30,000 and may have a weight average molecular weight of 10,000 to 300,000. The side chain of the branched polymer may contain an aromatic ring.

In this aspect, the branched polymer may further have a main chain. The main chain of the branched polymer may be an aliphatic. The branched polymer may have a number average molecular weight of 1,000 to 100,000 and may have a weight average molecular weight of 1,000 to 1,000,000.

The side chain of the branched polymer may have at least one of the amide group and the amino group. The side chain of the branched polymer may have a group containing sulfur. The group containing sulfur may be a sulfide group or a dithiocarbamate group.

In this aspect, the branched polymer may be represented by the following formula (1) or the following formula (3).

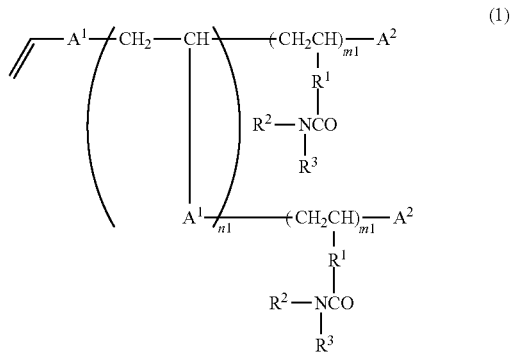

In the formula (1), $A^1$ is a group containing an aromatic ring, $A^2$ is a group containing sulfur or an amino group, $R^1$ is a single bond or a substituted or unsubstituted alkylene group having 1 to 5 carbon atoms, each of $R^2$ and $R^3$ is hydrogen or a substituted or unsubstituted alkyl group having 1 to 10 carbon atoms, and m1 is in a range of 1 to 10, and n1 is in a range of 5 to 100.

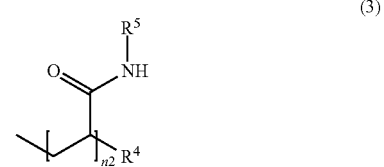

In the formula (3), $R^4$ is hydrogen or a group selected from the group consisting of a substituted or unsubstituted alkyl group having 1 to 10 carbon atoms, a group containing sulfur, an amino group, a carboxyl group, an imide group, and a silane group, $R^5$ is hydrogen or a substituted or unsubstituted alkyl group having 1 to 10 carbon atoms, and n2 is in a range of 5 to 1,000.

The branched polymer may be represented by the formula (1), in the formula (1), $A^1$ may be a group represented by the following formula (2), $A^2$ may be a dithiocarbamate group, $R^1$ may be a single bond, $R^2$ may be hydrogen, and $R^3$ may be an isopropyl group.

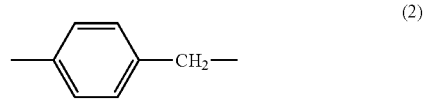

The branched polymer may be represented by the formula (3), in the formula (3), $R^4$ may be a methyl group or a group represented by the following formula (4), and $R^5$ may be an isopropyl group.

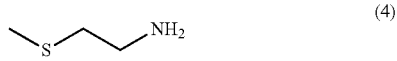 (4)

In this aspect, the polymer may have a main chain, and the main chain may have at least one of the amide group and the amino group. The main chain may further have an imide group.

In this aspect, the catalyst activity inhibiting layer may be removed from the light-irradiated portion or the heated portion of the surface by heating or irradiating with the light the part of the surface of the base member. The heating or irradiating with the light the part of the surface of the base member may be laser drawing performed on the surface of the base member by use of a laser beam.

According to a second aspect of the present teaching, there is provided a plated part, including: a base member; a plating film formed on a part of a surface of the base member; and a resin layer which is formed in an area, of the surface of the base member, where the plating film is not formed and which contains a polymer having at least one of an amide group and an amino group.

The base member may be a resin or an insulating inorganic material. The plated part may be an electronic part.

According to a third aspect of the present teaching, there is provided a catalyst activity inhibitor which inhibits catalyst activity of an electroless plating catalyst, including a polymer which has at least one of an amide group and an amino group.

According to a fourth aspect of the present teaching, there is provided a composite material for electroless plating, including: a base member and a resin layer which is formed on a surface of the base member and which contains a polymer having at least one of an amide group and an amino group.

BRIEF DESCRIPTION OF DRAWINGS

FIG. 1 is a flowchart illustrating a method for producing a plated part according to an embodiment.

Figure 2A:
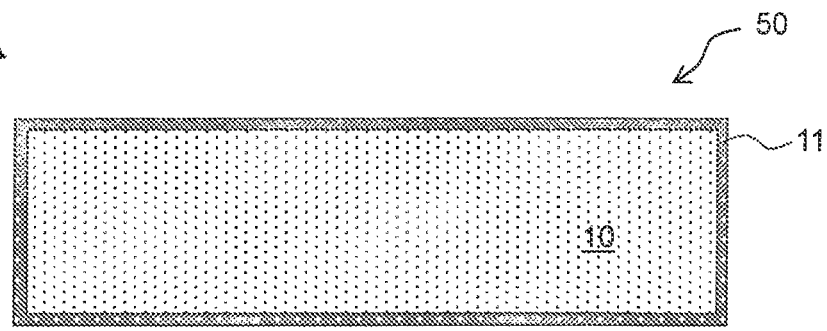
FIGS. 2A to 2C explain the method for producing the plated part according to the embodiment.

DESCRIPTION OF THE PREFERRED EMBODIMENT (1) Method for Producing Plated Part

An explanation will be made in accordance with a flowchart shown in FIG. 1 about a method for producing a plated part (plated component) in which a plating film having a predefined pattern is formed on a base member. At first, a catalyst activity inhibiting layer 11, which contains a polymer having at least one of an amide group and an amino group, is formed on a surface of a base member 10 shown in FIG. 2A (Step S1 in FIG. 1). The material of the base member 10 is not specifically limited. However, it is preferable to use an insulator in view of the formation of an electroless plating film on the surface. It is possible to use, for example, thermoplastic resin, thermosetting resin, photocurable resin, ceramics, and glass. Especially, the base member 10 to be used in this embodiment is preferably a resin base member made by resin, in view of the easiness of molding.

As for the thermoplastic resin, it is possible to use polyamides including, for example, nylon 6 (PA6), nylon 66 (PA66), nylon 12 (PA12), nylon 11 (PA11), nylon 6T (PA6T), nylon 9T (PA9T), 10T nylon, 11T nylon, nylon MXD6 (PAMXD6), nylon 9T-6T copolymer, and nylon 6-66 copolymer. As for the resin other than polyamide, it is possible to use, for example, polypropylene, polymethyl methacrylate, polycarbonate, amorphous polyolefin, polyether imide, polyethylene terephthalate, polyether ether ketone, ABS-based resin, polyphenylene sulfide (PPS), polyamide imide, polylactic acid, polycaprolactone, liquid crystal polymer, and cycloolefin polymer.

In particular, when a plated part requiring the solder reflow resistance is produced, it is preferable to use aromatic nylon such as nylon 6T (PA6T), nylon 9T (PA9T), 10T nylon, 11T nylon, nylon MXD6 (PAMXD6) and the like and copolymers containing them, as the thermoplastic resin which is provided with both of the heat resistance and the moldability. Then, in view of the improvement in the dimension stability and the rigidity, an inorganic filler such as a glass filler, a mineral filler or the like may be charged into the thermoplastic resin as described above. Specifically, it is possible to use, for example, Amodel (product name) produced by Solvay Advanced Polymers, Genestar (product name) produced by Kuraray, Vyloamide (product name) produced by Toyobo, and Reny (product name) produced by Mitsubishi Engineering-Plastics Toyobo. Further, when the solder reflow resistance is not required for the plated part, it is possible to use, for example, a general purpose engineering plastic, such as ABS resin, polycarbonate (PC), and polymer alloy of ABS resin and PC (ABS/PC). When a high-frequency antenna is produced as the plated part, it is preferable to use polyphenylene sulfide, liquid crystal polymer, and cycloolefin polymer, as the thermoplastic resin having electrical characteristics suitable for the high-frequency antenna. Further, when a commercially available thermoplastic resin is used, it is allowable to use a black thermoplastic resin which is commercially available as the black grade, in order that the heat is easily generated by absorbing the laser beam in the laser beam irradiation step as the aftertreatment step. Only one kind of the thermoplastic resin as described above may be used singly, or two or more kinds of the thermoplastic resins may be used in combination.

As for the thermosetting resin, it is possible to use, for example, silicone resin and epoxy resin. When a transparent thermosetting resin is used, it is thereby possible to produce a device (plated part) which is transparent and which has the solder reflow resistance. As for the photocurable resin, it is possible to use, for example, acrylic resin, silicone resin, epoxy resin, and polyimide. Further, as for the ceramics, it is possible to use, for example, alumina, aluminum nitride, lead titanate zirconate (PZT), barium titanate, and silicon wafer.

In order that the heat is easily generated by absorbing the laser beam in the laser beam irradiation step as the aftertreatment step, the base member 10 may contain, as a light absorbing agent, a filler such as carbon and the like, and/or a light-absorbing coloring matter such as cyanine compound, phthalocyanine compound, dithiol metal complex, naphthoquinone compound, diimmonium compound, azo compound and the like.

The base member 10, which is used in this embodiment, may be a commercially available product. Alternatively, the base member may be produced from a commercially available material by means of the molding or the like. For example, it is also allowable to produce a ceramics base member having a complicated shape in accordance with the powder injection molding method. Further, it is also allowable to produce a resin molded product (base member) by molding a commercially available thermoplastic resin into a desired shape. As for the method for molding the thermoplastic resin, it is possible to use the general purpose injection molding method and the extrusion molding method. The resin molded product may be a sheet-shaped molded product produced by the extrusion molding. Further, the base member 10 may be shaped with a 3D printer by using a photocurable resin or a thermoplastic resin. When the 3D printer is used, it is possible to produce the base member having a complicated shape. It is possible to produce MID having a complicated shape by using this base member.

The base member 10 used in this embodiment may be a foamed molded product having foamed cells therein. Using the foamed molded product as the base member 10 can produce lightweight MID having high precision in size. The foamed cells in the foamed molded product may be closed cells or open cells. The foamed molded product can be produced by subjecting a thermoplastic resin to foam molding by use of a chemical foaming agent or a physical foaming agent such as supercritical fluid.

The catalyst activity inhibiting layer 11 (hereinafter referred to as an "inhibiting layer" as appropriate) contains the polymer (hereinafter referred to as an "amide group/amino group-containing polymer" as appropriate) having at least one of the amide group and the amino group. The amide group/amino group-containing polymer functions as a catalyst activity inhibitor that prevents (inhibits) or reduces the catalyst activity of an electroless plating catalyst to be applied on the inhibiting layer 11 in the aftertreatment step. The amide group/amino group-containing polymer functioning as the catalyst activity inhibitor can uniformly cover the surface of the base member of different types as a resin layer (catalyst activity inhibiting layer), thus inhibiting an electroless plating reaction at portions in which no plating film formation is desired. The producing method of this embodiment thus has a wide range for selecting the base member.

The amide group/amino group-containing polymer may be a polymer having the amide group only, may be a polymer having the amino group only, or a polymer having both the amide group and the amino group. The amide group/amino group-containing polymer may be any polymer, but in view of the inhibition of catalyst activity of the electroless plating catalyst, it is preferable to use the polymer having the amide group or a branched polymer having a side chain. In the branched polymer, the side chain preferably contains at least one of the amide group and the amino group, more preferably contains the amide group.

Although the mechanism, in accordance with which the amide group/amino group-containing polymer inhibits the catalyst activity of the electroless plating catalyst, is not clear, it is assumed, as follows. The amide group and/or amino group form(s) a composite(s) through adsorption, coordination, reaction, or the like with respect to the electroless plating catalyst, which causes the electroless plating catalyst to be trapped by the amide group/amino group-containing polymer. In particular, the amide group and/or the amino group in the side chain of the branched polymer has/have a lot of flexibility, and many amide groups and/or amino groups can be contained in a molecule of the branched polymer. Thus, in the branched polymer, multiple amide groups and/or amino groups can efficiently and strongly trap the electroless plating catalyst. For example, the branched polymer functions as a multidentate ligand, multiple amide groups and/or amino groups can be coordinated with the electroless plating catalyst, and thus forming a chelate structure. The electroless plating catalyst trapped as described above can not exhibit the catalyst activity. For example, when metal such as palladium is applied, as the electroless plating catalyst, on the inhibiting layer 11, the amide groups and/or amino groups of the branched polymer trap the palladium in a state of palladium ion. The palladium ion becomes metallic palladium by being reduced by a reducing agent contained in an electroless plating solution, and the metallic palladium exhibits the electroless plating catalyst activity. The palladium ion trapped by the branched polymer, however, is not reduced by the reducing agent contained in the electroless plating solution, and thus can not exhibit the catalyst activity. This inhibits the formation of the electroless plating film on the surface of the base member 10 on which the inhibiting layer 11 is formed. This mechanism, however, is just an assumption, and the present teaching is not limited to this.

The amide group in the amide group/amino group-containing polymer is not specifically limited, and may be any of a primary amide group, a secondary amide group, and a tertiary amide group. The amino group in the amide group/amino group-containing polymer is not specifically limited, and may be any of a primary amino group, a secondary amino group, and a tertiary amino group. The polymer may contain one kind of the amide group and/or one kind of the amino group, or may contain two or more kinds of the amide groups and/or two or more kinds of the amino groups.

When the branched polymer is used as the amide group/amino group-containing polymer, the amide group in the branched polymer may be the secondary amide group, and an isopropyl group is preferably bonded to nitrogen of the amide group in order to efficiently inhibit the catalyst activity of the electroless plating catalyst. The amino group in the branched polymer is preferably the primary amino group ($-NH_2$) or the secondary amino group ($-NH-$).

The side chain of the branched polymer has at least one of the amide group or the amino group. Further, the side chain may have a group containing sulfur. Similar to the amide group and the amino group described above, the group containing sulfur tends to, for example, adsorb the electroless plating catalyst. This facilitates the effect in which the branched polymer inhibits the catalyst activity of the electroless plating catalyst. The group containing sulfur is not specifically limited, and is, for example, sulfide group, dithiocarbamate group, and thiocyanate group. The group containing sulfur is preferably the sulfide group or the dithiocarbamate group. The side chain of the branched polymer may contain only one kind of the group containing sulfur as described above or two or more kinds of the groups containing sulfur.

The branched polymer is preferably a dendritic polymer. The dendritic polymer is a polymer having a molecular structure that frequently repeats regular branching. The dendritic polymer is classified into a dendrimer and a hyper-branched polymer. The dendrimer, which is a spherical polymer having a diameter of several nanometers, has a dendritic branched structure that is branched regularly and completely with a molecule, which is a nucleus, as a center. The hyper-branched polymer, which is a polymer having an uncomplete dendritic branched structure, is different from the dendrimer having the complete dendritic branched structure. The hyper-branched polymer is more inexpensive and relatively easier to be synthesized or composed than the dendrimer. The hyper-branched polymer is thus preferably used as the branched polymer in this embodiment.

In this embodiment, a portion(s) except for the molecule that is the nucleus of each of the dendrimer and the hyper-branched polymer is/are defined as the side chain(s) of each of the dendrimer and the hyper-branched polymer. Each of the dendrimer and the hyper-branched polymer used in this embodiment thus has at least one of the amide group and the amino group in each side chain, namely, in the portion except for the molecule that is the nucleus. The dendritic polymer, which has many side chains having a lot of flexibility, is easily adsorbed to the electroless plating catalyst, thus making it possible to efficiently inhibit the catalyst activity of the electroless plating catalyst. This allows the dendritic polymer to efficiently function as the catalyst activity inhibitor after the dendritic polymer is made to become a thin film. Further, a solution of the dendritic polymer has low viscosity even when the solution has high concentration. The solution is thus capable of forming the inhibiting layer having a uniform thickness on a base member having a complicated shape. Further, since the dendritic polymer has satisfactory heat resistance, the dendritic polymer is suitable for the plated part requiring the solder reflow resistance.

In addition to the amide group and/or the amino group, the dendritic polymer may contain a functional group having high affinity for the base member. This strengthens an adhesion property between the base member 10 and the inhibiting layer 11 shown in FIGS. 2A to 2C. The functional group having high affinity for the base member can be appropriately selected depending on the type of the base member. For example, when the base member is a material having an aromatic ring, such as polyphenylene sulfide and liquid crystal polymer, the dendritic polymer preferably contains the aromatic ring. When the base member is glass, the dendritic polymer preferably contains a silanol group having high affinity for glass.

In the dendritic polymer of this embodiment, the number average molecular weight is preferably in a range of 3,000 to 30,000, more preferably in a range of 5,000 to 30,000, and the weight average molecular weight is preferably in a range of 10,000 to 300,000, more preferably in a range of 20,000 to 200,000. When the number average molecular weight and the weight average molecular weight are smaller than the above ranges, the quantity or amount of the functional group per one molecule may decrease, which may reduce the efficiency as the catalytic activity inhibitor. Meanwhile, the number average molecular weight and the weight average molecular weight may be larger than the above ranges. In that case, for example, when a producing method, in which the catalyst activity inhibiting layer 11 is formed by dissolving the dendritic polymer in a solvent, is used, solubility of the dendritic polymer in the solvent may be unsatisfactory, which may cause a disadvantage in production.

The dendritic polymer of this embodiment is preferably a branched polymer represented by the following formula (1). The branched polymer represented by the formula (1) efficiently functions as the catalytic activity inhibitor.

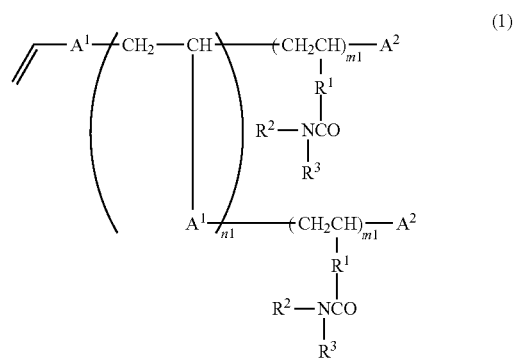

In the formula (1), $A^1$ is a group containing an aromatic ring, $A^2$ is a group containing sulfur or an amino group, $R^1$ is a single bond or a substituted or unsubstituted alkylene group having 1 to 5 carbon atoms, $R^2$ and $R^3$ may be identical with each other or different from each other, and each of $R^2$ and $R^3$ is hydrogen or a substituted or unsubstituted alkyl group having 1 to 10 carbon atoms. Each of $R^1$, $R^2$, and $R^3$ may have a straight chain or a branched chain. Further, m1 is in a range of 1 to 10, and n1 is in a range of 5 to 100.

In the formula (1), $A^1$ is preferably a group represented by the following formula (2), $A^2$ is a preferably a dithiocarbamate group, $R^1$ is preferably a single bond, $R^2$ is preferably hydrogen, and $R^3$ is preferably an isopropyl group.

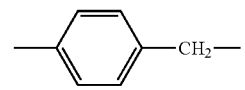

The branched polymer of this embodiment may be any other branched polymer than the dendritic polymer. In that case, the branched polymer has a main chain in addition to the side chain. In the branched polymer having the main chain and the side chain, the main chain may contain the amide group and/or the amino group, or the side chain may contain the amide group and/or the amino group. In view of the inhibition of the catalyst activity of the electroless plating catalyst, the side chain preferably contains the amide group and/or the amino group. The main chain of the branched polymer may contain a functional group having high affinity for the base member. This strengthens the adhesion property between the base member 10 and the inhibiting layer 11 shown in FIGS. 2A to 2C. When the branched polymer contains the main chain and the side chain, the main chain preferably has an adhesion-property improving function between the base member 10 and the inhibiting layer 11 by containing the functional group having high affinity for the base member, and the side chain preferably has a catalyst-activity inhibiting function by containing the amide group and/or the amino group. It is assumed that distinguishing the functions from each other enhances the flexibility of the side chain having the amide group and/or amino group, making it easy for the branched polymer to trap the electroless plating catalyst. Similar to the dendritic polymer as described above, the functional group having high affinity for the base member can be appropriately selected depending on the type of the base member.

In the branched polymer having the main chain and the side chain according to this embodiment, the number average molecular weight is preferably in a range of 1,000 to 100,000, more preferably in a range of 5,000 to 50,000, and the weight average molecular weight is preferably in a range of 1,000 to 1,000,000, more preferably in a range of 5,000 to 200,000. When the number average molecular weight and the weight average molecular weight are smaller than the above ranges, the quantity or amount of the functional group per one molecule may decrease, which may reduce the efficiency as the catalytic activity inhibitor. Meanwhile, the number average molecular weight and the weight average molecular weight may be larger than the above ranges. In that case, for example, when a producing method, in which the catalyst activity inhibiting layer 11 is formed by dissolving the branched polymer in a solvent, is used, solubility of the branched polymer in the solvent may be unsatisfactory, which may cause a disadvantage in production.

The branched polymer having the main chain and the side chain according to this embodiment may be an acrylamide-based resin, preferably a branched polymer represented by the following formula (3). The branched polymer represented by the formula (3) efficiently functions as the catalytic activity inhibitor.

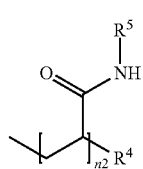

(3)

In the formula (3), $R^4$ is hydrogen or a group selected from the group consisting of a substituted or unsubstituted alkyl group having 1 to 10 carbon atoms, a group containing sulfur, an amino group, a carboxyl group, an imide group, and a silane group, $R^5$ is hydrogen or a substituted or unsubstituted alkyl group having 1 to 10 carbon atoms. Each of $R^4$ and $R^5$ may have a straight chain or a branched chain. Further, n2 is in a range of 5 to 1,000.

In the formula (3), $R^4$ is preferably a methyl group or a group represented by the following formula (4), and $R^5$ is preferably an isopropyl group.

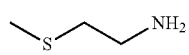

(4)

The amide group/amino group-containing polymer used in this embodiment may be any other polymer than the branched polymer, provided that the polymer has the amide group and/or the amino group. Namely, the amide group/amino group-containing polymer may be a straight-chain polymer that has no side chain but has the main chain, and the main chain of the straight-chain polymer may have at least one of the amide group and the amino group. The main chain of the amide group/amino group-containing polymer may further have an imide group. Similar to the amide group and amino group described above, the imide group tends to, for example, adsorb the electroless plating catalyst. This facilitates the effect of inhibiting the catalyst activity of the electroless plating catalyst. The polymer having the imide group is exemplified, for example, by polyamideimide.

In addition to the amide group/amino group-containing polymer, the inhibiting layer 11 may contain, as a light absorbing agent, a filler such as carbon, and/or a light-absorbing coloring matter such as cyanine compound, phthalocyanine compound, dithiol metal complex, naphthoquinone compound, diimmonium compound, and azo compound, in order to easily generate the heat by absorbing the laser beam in the laser beam irradiation step as the after-treatment step. The light absorbing agent may be dissolved or dispersed in a solvent or the like, which may be applied to a surface of the inhibiting layer 11. It is preferable that the light absorbing agent is previously contained in the inhibiting layer 11 in view of the simplicity and convenience of the operation.

The inhibiting layer 11 may not contain any other polymer than the amide group/amino group-containing polymer, or may contain, together with the amide group/amino group-containing polymer, any other polymer that does not inhibit the catalyst activity. Although the inhibiting layer 11 preferably does not contain any other polymer than the amide group/amino group-containing polymer in view of the catalyst activity inhibition, the inhibiting layer 11 may contain any other polymer to improve other characteristics, such as the adhesion property between the inhibiting layer 11 and the base member 10. Further, the inhibiting layer 11 may contain, as needed, a publicly known additive such as a surfactant.

The amide group/amino group-containing polymer is preferably a main component of the inhibiting layer 11. The inhibiting layer 11 contains, for example, 30 to 100% by weight of the amide group/amino group-containing polymer, preferably 50 to 100% by weight of the amide group/amino group-containing polymer, more preferably 70 to 100% by weight of the amide group/amino group-containing polymer. When the inhibiting layer 11 contains the amide group/amino group-containing polymer in each of the above ranges, the inhibiting layer 11 can satisfactorily inhibit generation or formation of the plating film on the base member 10.

The inhibiting layer 11 is preferably thin so that the inhibiting layer 11 has no influence on physical properties such as heat resistance and electronic properties such as permittivity, of the base member 10. For example, the thickness of the inhibiting layer 11 is preferably equal to or less than 5,000 nm, more preferably equal to or less than 1,000 nm, further more preferably equal to or less than 300 nm. In view of the inhibition of the catalyst activity of the electroless plating catalyst, for example, the thickness of the inhibiting layer 11 is preferably equal to or more than 10 nm, more preferably equal to or more than 30 nm, further more preferably equal to or more than 50 nm. In order to inhibit formation of the electroless plating film at portions other than the predefined pattern, the inhibiting layer 11 is preferably formed in at least an area, of the surface of the base member 10, which comes into contact with the electroless plating solution in the electroless plating step as the after-treatment step, more preferably formed on the entire surface of the base member 10.

The method of forming the inhibiting layer 11 on the surface of the base member 10 is not specifically limited. For example, the inhibiting layer 11 may be formed by preparing a polymer solution obtained by dissolving or dispersing the amide group/amino group-containing polymer in a solvent, and then coming the polymer solution into contact with the base member 10. The method of coming the polymer solution into contact with the base member 10 may be a method of coating the base member 10 with the polymer solution, or a method of immersing the base member 10 in the polymer solution. Specifically, the method of forming the inhibiting layer 11 includes, for example, dip coating, screen coating, and spray coating. In view of uniformity of the inhibiting layer 11 formed and simplicity and convenience of the operation, the method of immersing the base member 10 in the polymer solution (dip coating) is preferably used.

When the polymer solution is used for forming the inhibiting layer 11, the blending amount of the amide group/amino group-containing polymer in the polymer solution (the concentration of the amide group/amino group-containing polymer) is not specifically limited, and can be appropriately determined in view of the type of the amide group/amino group-containing polymer, the type of the solvent, the molecular weight of the amide group/amino group-containing polymer, the film thickness of the inhibiting layer 11 formed, and the like. The blending amount of the amide group/amino group-containing polymer in the polymer solution is, for example, in a range of 0.01 to 5% by weight, or preferably in a range of 0.1 to 2% by weight.

The solvent (medium) used for the polymer solution is not specifically limited, provided that the amide group/amino group-containing polymer can be dissolved or dispersed therein and the solvent does not change the quality of the base member 10. It is preferably to use, for example, ketones such as methyl ethyl ketone and methyl isobutyl ketone; alcohols such as ethanol, methanol, and isopropyl alcohol; glycol ethers such as dipropylene glycol monomethylether and 2-butoxy ethanol; compounds having an aromatic ring such as toluene and benzene; N-methyl pyrrolidone; cyclohexanone; tetrahydrofuran; and mixtures thereof. In addition to the amide group/amino group-containing polymer and the solvent, the polymer solution may contain, as needed, a publicly known additive such as the light absorbing agent described above, another polymer, and a surfactant. The polymer solution can be prepared by mixing the above-described components or ingredients through a conventionally known method.

The temperature and immersion time of the polymer solution when the base member 10 is immersed in the polymer solution are not specifically limited, and can be appropriately determined in view of the type of the amide group/amino group-containing polymer, the type of the solvent, the molecular weight of the amide group/amino group-containing polymer, the film thickness of the inhibiting layer formed, and the like. The temperature of the polymer solution is, for example, in a range of 0 to 100° C., preferably in a range of 10 to 50° C. The immersion time is, for example, in a range of one second to 10 minutes, preferably in a range of five seconds to two minutes.

Figure 2B:
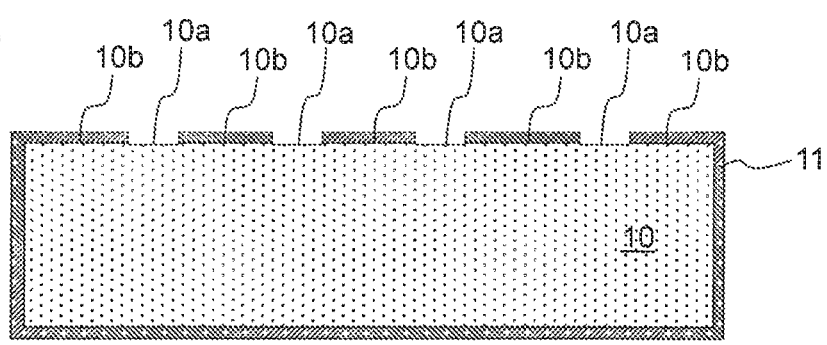

Performing the above-explained step (Step S1 in FIG. 1) results in a composite material 50 for electroless plating including the base member 10 and the resin layer 11 which is formed on the surface of the base member 10 and contains the amide group/amino group-containing polymer, shown in FIG. 2A. The electroless plating film can be selectively formed at a portion irradiated with the laser beam by subjecting the composite material 50 to electroless plating (Step S4) after performing the laser beam irradiation step (Step S2 in FIG. 1), an electroless-plating-catalyst application step (Step S3), and the like, those of which are described below.

Subsequently, energy is applied to a surface of the composite material 50 obtained, namely, to a part of the surface of the base member 10 on which the inhibiting layer 11 is formed. The energy application is performed by light irradiation or heating (Step S2 in FIG. 1). The method for radiating the light is not specifically limited, which is exemplified by a method in which a laser beam is radiated onto the surface of the base member 11 in accordance with a predefined pattern (laser drawing) and a method in which a portion to be not irradiated with light is masked, and then the entire surface of the base member 11 is irradiated with light. It is speculated that the light is converted into the heat by irradiating the part of the surface of the base member 10 with the light, and the surface of the base member 10 is heated. As described above, when the base member 10 contains the light absorbing agent, the light, which is radiated onto the base member 10, can be efficiently converted into the heat. Further, the method for heating the surface of the base member 10 without radiating any light onto the surface of the base member 10 is exemplified, for example, by a method in which the surface of the base member 10 is directly thermally pressed with a simple and elementary mold or the like having a pattern formed by protrusions. In view of the simplicity and convenience of the operation, the selectivity of the heated portion, the easiness of pattern change, and the easiness of making the pattern fine, it is preferable to heat the base member 10 by means of the laser drawing.

The laser beam can be radiated by using a laser apparatus including, for example, a $CO_2$ laser, a $YVO_4$ laser, and a YAG laser. The laser apparatuses as described above can be appropriately selected depending on the type of the amide group/amino group-containing polymer used for the inhibiting layer 11.

In this embodiment, the portion irradiated with the laser beam is heated by radiating the laser beam onto the surface of the base member 10 in accordance with the predefined pattern (laser drawing), and the inhibiting layer 11 existing at the heated portion is removed. In this case, the phrase "removal of the inhibiting layer 11" means, for example, such a situation that the inhibiting layer 11 existing at the heated portion disappears on account of the evaporation. When the laser drawing of the predefined pattern is performed on the surface of the base member 10 applied with the inhibiting layer 11, it is thereby possible to form an inhibiting layer-removed portion 10a which has the predefined pattern and an inhibiting layer-remaining portion 10b in which the inhibiting layer 11 remains. Note that a surface layer portion of the base member 10 may evaporate and disappear together with the inhibiting layer 11 at the inhibiting layer-removed portion 10a that is the heated portion. Further, the phrase "removal of the inhibiting layer 11" includes not only the complete disappearance of the inhibiting layer 11 but also a case in which the inhibiting layer 11 remains to such an extent that no influence is exerted on the progress of the electroless plating treatment to be performed in the aftertreatment step. Even when the inhibiting layer 11 remains, if no influence is exerted on the electroless plating treatment to be performed in the aftertreatment step, then the function to inhibit the catalyst activity of the electroless plating catalyst disappears. Further, in this embodiment, the situation, in which the inhibiting layer 11 existing at the heated portion is denatured or modified in quality and the inhibiting layer 11 does not function as the inhibiting layer 11, is also included in the "removal of the inhibiting layer 11". This situation is exemplified, for example, by such a situation in which the amide group and/or the amino group of the amide group/amino group-containing polymer is/are denatured or modified in quality, making it impossible for the amide group/amino group-containing polymer to trap the electroless plating catalyst. In this case, the inhibiting layer 11 existing at the heated portion does not disappear completely, and any denatured matter (modified matter) remains. The denatured matter, however, does not inhibit the catalyst activity. Therefore, the portion, at which the inhibiting layer 11 is denatured or modified in quality, also provides the function which is the same as or equivalent to that of the inhibiting layer-removed portion 10a at which the inhibiting layer 11 disappears.

In this embodiment, the surface of the base member 10 is preferably washed after the laser beam irradiation. When the denatured matter (modified matter) of the inhibiting layer 11 remains at the inhibiting layer-removed portion 10a due to the laser beam irradiation, the denatured matter (modified matter) may widely fly or scatter over the surface of the base member 10. This denatured matter (modified matter) does not inhibit the catalyst activity. Thus, when the denatured matter (modified matter) adheres to the inhibiting layer-remaining portion 10b, the plating film is formed or generated at the portion to which the denatured matter (modified matter) adheres, at the time of electroless plating as the aftertreatment step. The denatured matter (modified matter) scattering over the surface of the base member 10 can be removed by washing the surface of the base member 10 after the laser beam irradiation. This inhibits formation of the plating film at portions other than the portion irradiated with the laser beam, improving plating selectivity. The washing of the surface of the base member 10 is preferably performed after the step in which the part of the surface of the base member 10 is heated or irradiated with the light (Step S2 in FIG. 1) and before the step in which the electroless plating solution is brought into contact with the surface of the base member 10 (Step S4 in FIG. 1). The washing of the surface of the base member 10 may be performed before or after the electroless-plating-catalyst application step (Step S3 in FIG. 1) provided that the washing is performed after the step of heating the surface of the base member 10 or the like (Step S2 in FIG. 1) and before the electroless plating step (Step S4 in FIG. 1). In view of the plating selectivity improvement, the washing of the surface of the base member 10 is preferably performed before the electroless-plating-catalyst application step.

The method of washing the surface of the base member 10 may be any method provided that the denatured matter (modified matter) of the inhibiting layer 11 scattering over the surface of the base member 10 can be removed. For example, the base member 10 irradiated with the laser beam may be immersed in a wash solution in which the denatured matter (modified matter) of the inhibiting layer 11 is dissolvable (immersion method). As the wash solution, it is possible to use a pretreatment agent for plating such as a defatting agent, a surface conditioner, and a conditioner; a surfactant solution; an alkaline solution; and the like.

Subsequently, the electroless plating catalyst is applied to the surface of the base member 10 irradiated with the laser beam (Step S3 in FIG. 1). Any arbitrary catalyst can be used as the electroless plating catalyst, provided that the catalyst has the ability of the electroless plating catalyst. However, it is possible to use, for example, metal fine particles, metal complexes, and metal alkoxides of, for example, Pd, Ni, Pt, and Cu. Especially, it is preferable to use the electroless plating catalyst containing Pd which has the high catalytic activity.

The method for applying the electroless plating catalyst to the surface of the base member 10 is not specifically limited. The electroless plating catalyst may be applied to the surface of the base member 10, for example, by preparing a catalyst solution in which the electroless plating catalyst is dissolved or dispersed in a solvent, and coating the base member 10 with the catalyst solution or immersing the base member 10 in the catalyst solution. In view of the uniformity or homogeneity of the application of the catalyst, it is preferable to use the method in which the base member 10 is immersed in the catalyst solution.

The solvent, which is used for the catalyst solution, is not specifically limited, provided that the catalyst can be dissolved or dispersed in the solvent. However, for example, it is possible to use water, alcohol such as methanol, ethanol, propyl alcohol, isopropyl alcohol, and butanol, and hydrocarbon such as hexane and heptane. As for the hydrocarbon, it is also allowable to use, for example, a commercially available high boiling point solvent (Isopar (product name), produced by Exxon Mobil Corporation). As for the electroless plating catalyst to be used for the catalyst solution, it is preferable to use a palladium complex in view of the high plating catalytic activity. Specifically, it is possible to use, for example, sodium tetrachloropalladate, potassium tetrachloropalladate, palladium acetate, palladium chloride, acetylacetonatopalladium (II), and hexafluoroacetylacetonatopalladium (II) metal complex. The blending amount (catalyst concentration) of the electroless plating catalyst in the catalyst solution can be, for example, in a range of 0.01 to 5% by weight.

Another method for applying the electroless plating catalyst to the surface of the base member 10 is exemplified by a general purpose method in which a commercially-available electroless plating catalyst solution is used, including, for example, a sensitizer-activator method and a catalyzer-accelerator method. In the sensitizer-activator method, the surface of the base member 10 is firstly treated, for example, with a solution containing $Sn^{2+}$ (sensitizer treatment) in order that the electroless plating catalyst easily adsorbs. Subsequently, the base member 10 is immersed in a solution containing the electroless plating catalyst (for example, $Pd^{2+}$) (activator treatment). In the catalyzer-accelerator method, the base member 10 is firstly immersed in a solution containing the electroless plating catalyst (for example, a palladium colloid solution obtained by mixing $Sn^{2+}$ and $Pd^{2+}$) (catalyzer treatment). Subsequently, the base member 10 is immersed, for example, in a hydrochloric acid solution to deposit the metal of the plating catalyst on the surface of the base member 10 (accelerator treatment).

Subsequently, the electroless plating solution is brought into contact with the surface of the base member 10 (Step S4 in FIG. 1). Accordingly, an electroless plating film 85 can be formed at the heated portion of the surface of the base member 10, and it is possible to produce a plated part 100 in which the plating film is selectively formed. An arbitrary general-purpose electroless plating solution can be used as the electroless plating solution depending on the object. However, in view of the fact that the catalytic activity is high and the solution is stable, it is preferable to use an electroless nickel phosphorus plating solution, an electroless copper plating solution, and an electroless nickel plating solution.

An electroless plating film of a different type may be further formed on the electroless plating film 85, or an electroplating film may be formed thereon by means of the electroplating. When the total thickness of the plating film on the base member 10 is thickened, it is thereby possible to decrease the electric resistance when the plating film having the predefined pattern is used as an electric circuit. In view of the decrease in the electric resistance of the plating film, the plating film, which is stacked on the electroless plating film 85, is preferably, for example, an electroless copper plating film, an electroplating copper film, and an electroplating nickel film. Further, the electroplating cannot be performed for an electrically isolated circuit. Therefore, in such a situation, it is preferable that the total thickness of the plating film on the base member 10 is thickened by means of the electroless plating. Further, in order to improve the solder wettability of the plating film pattern so that it is possible to respond to the solder reflow, it is also appropriate that a plating film of stannum, gold, silver or the like is formed on the outermost surface of the plating film pattern.

In this embodiment, the inhibiting layer-remaining portion 10b in which the inhibiting layer 11 remains and the inhibiting layer-removed portion 10a having the predefined pattern and from which the inhibiting layer 11 is removed by the heating, exist on the surface of the base member 10. Then, the electroless plating catalyst is applied to the surface of the base member 10 and the electroless plating solution is brought into contact therewith. Thus, the electroless plating film 85 can be formed at only the inhibiting layer-removed portion 10a having the predefined pattern. In this embodiment, the formation of the plating film is inhibited at portions other than the predefined pattern and the plating film 85 can be formed only at the predefined pattern in accordance with the simple and easy production process with respect to the base member of various materials.

The method for producing the plated part according to this embodiment described above uses the amide group/amino group-containing polymer as the catalyst activity inhibitor. Thus, the surface of the base member of different types can be coated uniformly with the resin layer of the catalyst activity inhibitor (catalyst activity inhibiting layer), inhibiting the electroless plating reaction at portions at which no plating film formation is desired. The producing method of this embodiment thus has a wide range for selecting the base member. For example, the inhibiting layer having a uniform thickness can be formed on a surface of a base member having a large surface roughness, a surface of a base member having a void, a surface of a foamed molded product having a foam mark on the surface thereof, and the like. Accordingly, in the method for producing the plated part having a wide range for selecting the base member according to this embodiment, any three-dimensional circuit formed product having a shape of any thin-walled sheet and any optical member including, for example, lenses and spectacles, those of which have been hitherto difficult to be produced, can be produced in accordance with the simple and easy method.

In conventional electroless plating methods, when the step of applying the electroless plating catalyst and the electroless plating step are performed continuously without replacement of a fixing jig that fixes the base member, a problem in which the electroless plating film is formed on the fixing jig has occurred. This embodiment can solve that problem by forming the catalyst activity inhibiting layer not only on the base member but also on the fixing jig for the base member in the step of forming the catalyst activity inhibiting layer on the base member (Step S1 in FIG. 1). Namely, the catalyst activity inhibiting layer formed on the fixing jig inhibits the formation of the electroless plating film. This improves the manufacturing efficiency of the plated part without requiring the replacement of fixing jig for the base member.

In the present teaching, the electroless plating film is formed at the heated portion or the light-irradiated portion of the base member surface, while the generation or formation of the electroless plating film is inhibited on account of the presence of the catalyst activity inhibiting layer at the portions other than the above. Accordingly, in the method for producing the plated part of the present teaching, the generation of the electroless plating film is inhibited at the portions other than the predefined pattern in accordance with the simple and easy production process, and it is possible to form the electroless plating film at only the predefined pattern. Further, in the method of the present teaching, the range of selection of the base member is wide, and it is also possible to reduce the production cost.

(2) Plated Part

Figure 2C:
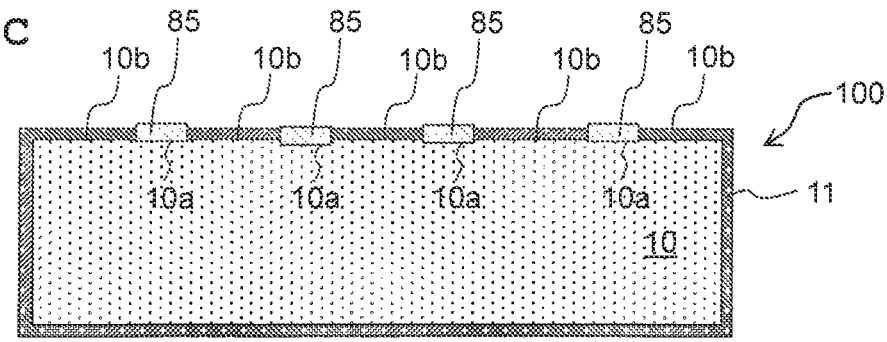

FIG. 2C shows the plated part 100 produced in this embodiment in which the plating film is selectively formed. The plated part 100 includes the base member 10, the plating film 85 formed on a part of the surface of the base member 10, and the catalyst activity inhibiting layer (resin layer) 11 formed in an area, of the surface of the base member, where the plating film 85 is not formed. The plating film 85 may form the predefined pattern on the surface of the base member 10. In that case, the catalyst activity inhibiting layer (resin layer) 11 is formed on portions, of the surface of the base member 10, where no predefined pattern exists.

The catalyst activity inhibiting layer 11 is a resin layer containing the amide group/amino group-containing polymer. The main component of the inhibiting layer is the amide group/amino group-containing polymer. The inhibiting layer 11 contains, for example, 30 to 100% by weight of the amide group/amino group-containing polymer, preferably 50 to 100% by weight of the amide group/amino group-containing polymer, and more preferably 70 to 100% by weight of the amide group/amino group-containing polymer. For example, the film thickness of the catalyst activity inhibiting layer 11 is preferably equal to or less than 5,000 nm, more preferably equal to or less than 1,000 nm, and more preferably equal to or less than 300 nm. In view of the inhibition of catalyst activity of the electroless plating catalyst, for example, the film thickness of the catalyst activity inhibiting layer 11 is preferably equal to or more than 10 nm, more preferably equal to or more than 30 nm, and further more preferably equal to or more than 50 nm.

The plating film 85 having the predefined pattern may have conductivity. In that case, the plating film 85 having the predefined pattern functions, for example, as an electrical wiring pattern, an electric circuit, or an antenna pattern, and the plated part 100 having the plating film 85 with the predefined pattern functions as an electronic part (electronic component) including a circuit part or an antenna. Further, the plating film 85 having the predefined pattern may be formed in a planar form on only one surface of the base member 10. Alternatively, the plating film 85 having the predefined pattern may be formed three-dimensionally over surfaces of the base member 10 or along a surface of a three-dimensional shape including, for example, a spherical surface. When the plating film 85 having the predefined pattern is formed three-dimensionally over the surfaces of the base member 10 or along the surface of the three-dimensional shape including, for example, the spherical surface, and the plating film 85 having the predefined pattern has the conductivity, then the plating film 85 having the predefined pattern functions as a three-dimensional electric circuit or a three-dimensional antenna, and the plated part 100 having the plating film 85 with the predefined pattern as described above functions as a three-dimensional circuit formed part (MID) or an MID antenna.

When the pattern including the plating film 85 functions as the electrical wiring pattern, the catalyst activity inhibiting layer 11 exists between adjoining electrical wirings. This catalyst activity inhibiting layer 11 improves the insulating performance between the electrical wirings, raising the wiring density of the electronic part. The electronic part has a problem, called migration, in which metallic ions are discharged from electrical wirings due to voltage application. In the plated part 100 of this embodiment, it is possible to expect that the catalyst activity inhibiting layer 11 provided between the adjoining electrical wirings traps the metallic ions discharged from the electrical wirings to prevent a short circuit between the wirings. Further, when the pattern including the plating film 85 is the antenna pattern, the catalyst activity inhibiting layer 11, which is the insulator provided in an area except for the antenna pattern, improves antenna performance.

Modified Embodiment

As shown in FIG. 2C, the plated part 100 produced in this embodiment described above includes the catalyst activity inhibiting layer 11 containing the amide group/amino group-containing polymer. This embodiment, however, is not limited thereto. The producing method of this embodiment may further include a step of removing the inhibiting layer 11 from the surface of the base member 10. In this modified embodiment, the catalyst activity inhibiting layer 11 is removed from the base member 10 after the step of applying the electroless plating catalyst to the surface of the base member 10 (Step S3 in FIG. 1) or after the step of forming the electroless plating film 85 (Step S4 in FIG. 1). Thus, the plated part produced in this modified embodiment, which does not include the inhibiting layer 11, is different from the plated part 100 shown in FIG. 2C.

The method of removing the inhibiting layer 11 from the base member 10 is exemplified by a method in which the base member 10 is washed with a washing solution so that the amide group/amino group-containing polymer is eluted in the washing solution and thereby the amide group/amino group-containing polymer is removed. The washing solution is not specifically limited, provided that the amide group/amino group-containing polymer is dissolved in the washing solution and the base member 10 is not denatured or modified in quality by the washing solution. The washing solution can be appropriately selected depending on the type of the base member 10 and the type of the amide group/amino group-containing polymer. For example, it is possible to use the same solution (media) as that used for the polymer solution described above.

EXAMPLES

In the following, the present teaching will be specifically explained with reference to Examples and Comparative Examples. However, the present teaching is not limited to or restricted by Examples and Comparative Examples described below. Note that formulae (5) to (10) representing the chemical structures of Polymers A to F used in Experiments 1 to 26 will be summarily described after the explanation of Experiment 26.

<Experiment 1>

In Experiment 1, Polymer A represented by a formula (5) is used as the amide group/amino group-containing polymer contained in the catalyst activity inhibiting layer.

(1) Synthetization of Polymer A

Amid groups were introduced to a commercially available hyper-branched polymer (Polymer D) to thereby synthesize Polymer A represented by the formula (5). Polymer A represented by the formula (5) is a polymer represented by the formula (1); in the formula (1), $A^1$ is a group represented by the formula (2), $A^2$ is a dithiocarbamate group, $R^1$ is a single bond, $R^2$ is hydrogen, and $R^3$ is an isopropyl group.

At first, a hyper-branched polymer (HYPERTECH HPS-200 produced by NISSAN CHEMICAL CORPORATION; 1.3 g, dithiocarbamate group: 4.9 mmol), N-isopropyl acrylamide (NIPAM) (1.10 g, 9.8 mmol), α-α'-azobisisobutyronitrile (AIBN) (81 mg, 0.49 mmol), and dehydrated tetrahydrofuran (THF) were added to a Schlenk flask, followed by being subject to freeze-deaeration three times. Afterwards, an oil bath was used to agitate and subject the mixture inside the Schlenk flask to reaction at 70° C. for one night (18 hours). After the completion of the reaction, the mixture was cooled with iced water, and was diluted appropriately by THF. Next, the mixture was subjected to re-precipitation in hexane; a solid product obtained thereby was subjected to vacuum drying at 60° C. for one night. The NMR (Nuclear Magnetic Resonance) and IR (InfraRed absorption spectrum) of the generated product were measured. From the results of the measurements, it was confirmed that the amid groups were introduced into the commercially available hyper-branched polymer represented by the formula (8), which in turn generated Polymer A represented by the formula (5). Next, the molecular weight of the generated product was measured by a GPC (Gel Permeation Chromatography). The molecular weight was: number-average molecular weight (Mn)=9,946; whereas weight-average molecular weight (Mw)=24,792, which were values, unique to the hyper-branched structure, that the number-average molecular weight (Mn) was greatly different from the weight-average molecular weight (Mw). The yield of Polymer A was 92%.

(2) Molding of Resin Molded Product (Base Member)

A general-purpose injection molding apparatus (J180AD-300H produced by JAPAN STEEL WORKS, LTD.) was used to mold a glass fiber-enhanced polyphenylene sulfide (PPS) (1040G, black color, produced by TEIJIN LIMITED) into a plate-shaped body or member having a size of 4 cm×6 cm×0.2 cm.

(3) Formation of Catalyst Activity Inhibiting Layer

The synthetized Polymer A represented by the formula (5) was dissolved in methylethyl ketone to prepare a polymer solution of which polymer concentration was 0.5% by weight. The molded base member was dipped in the prepared polymer solution at the room temperature for 5 seconds, and then was subjected to drying in a drier at 85° C. for 5 minutes. With this, a catalyst activity inhibiting layer was formed on a surface of the base member.

The film thickness of the catalyst activity inhibiting layer was measured by a method as explained below. Firstly, a sample for film thickness measurement, having a resin layer formed thereon under a same condition as that of this experiment, was prepared. A part of the resin layer of the sample for film thickness measurement was damaged by a spatula to allow the base member to be exposed in the damaged part; a laser microscope (VK-9710 produced by KEYENCE CORPORATION) was used to measure the different in height between the surface of the resin layer and the exposed surface of the base member, and the result of the measurement was determined to be the film thickness of the catalyst activity inhibiting layer. The film thickness of the catalyst activity inhibiting layer was approximately 70 nm.

(4) Laser Drawing

A laser drawing apparatus (MD-V9929WA produced by KEYENCE CORPORATION; $YVO_4$ laser; wavelength: 1064 nm) was used to perform laser drawing for the resin molded product having the catalyst activity inhibiting layer formed thereon, with laser intensity: 80%, drawing velocity:

500 mm/sec and frequency: 50 kHz. The drawn pattern was a pattern in which a plurality of pieces of an area of 5 mm×5 cm were aligned at a pitch of 0.1 mm.

(5) Application of Electroless Plating Catalyst

A commercially available catalytic solution for electroless plating was used to apply an electroless plating catalyst, with a generally known method, to a surface of the molded product having the laser drawing performed thereon. Firstly, the molded product having the laser drawing performed thereon was immersed in a sensitivity imparting agent at a normal temperature (SENSITIZER produced by OKUNO CHEMICAL INDUSTRIES CO., LTD) and was irradiated with ultrasonic waves for 5 minutes to thereby perform a sensitizing processing; and thus tin colloid was made to adsorb onto the surface of the molded product. Afterwards, the molded product was taken out from the sensitivity imparting agent, and was washed by water sufficiently. Next, the molded product was immersed in a catalyzing treatment agent at a normal temperature (ACTIVATOR produced by OKUNO CHEMICAL INDUSTRIES CO., LTD.), was left to stand for 2 minutes, and thus was subjected to an activator processing so that palladium was made to absorb onto the surface of the molded product. Afterwards, the molded product was taken out from the catalyzing treatment agent, and was washed by water sufficiently.

(6) Electroless Plating

The molded product having the electroless plating catalyst applied thereto was immersed in an electroless copper plating solution (OPC-NCA produced by OKUNO CHEMICAL INDUSTRIES CO., LTD.) for 15 minutes to grow an electroless copper plating film on the surface of the molded product such that the electroless copper plating film had a thickness of 1 μm. By the production method as explained above, a plated part (plated component) of Experiment 1 was obtained.

<Experiment 2>

In Experiment 2, a plated part was produced by a method similar to that in Experiment 1, except that a $CO_2$ laser drawing apparatus was used in the laser drawing.

(1) Molding of Resin Molded Product (Base Member) and Formation of Catalyst Activity Inhibiting Layer A resin molded product (PPS) as the base member was molded and a catalyst activity inhibiting layer containing Polymer A was formed on a surface of the base member, by a method similar to that in Experiment 1.

(2) Laser Drawing

A $CO_2$ laser drawing apparatus (LP-310 produced by PANASONIC CORPORATION; light source: $CO_2$; output of laser oscillating section: 12 W on average; light emission peak wavelength: 10.6 μm) was used as the laser drawing apparatus so as to perform laser drawing for the resin molded product having the catalyst activity inhibiting layer formed thereon, with laser intensity: 80%, and drawing velocity: 500 mm/sec. The drawn pattern was a pattern similar to that in Experiment 1.

(3) Application of Electroless Plating Catalyst and Electroless Plating

The application of the electroless plating catalyst and the electroless plating were performed in this order on the molded product having the laser drawing performed thereon, by a method similar to that in Experiment 1. With this, an electroless copper plating film was grown on the surface of the base member such that the electroless copper plating film had a thickness of 1 μm. By the production method as explained above, a plated part of Experiment 2 was obtained.

<Experiment 3>

In Experiment 3, a plated part was produced by a method similar to that in Experiment 1, except that an electroless nickel phosphorous plating solution was used as the plating solution.

(1) Molding of Resin Molded Product (Base Member), Formation of Catalyst Activity Inhibiting Layer, Laser Drawing and Application of Electroless Plating Catalyst A resin molded product (PPS) was molded and a catalyst activity inhibiting layer containing Polymer A was formed on a surface of the base member, by a method similar to that in Experiment 1. The laser drawing and the application of electroless plating catalyst were performed in this order for the molded product having the catalyst activity inhibiting layer formed thereon, by a method similar to that in Experiment 1.

(2) Electroless Plating

The molded product having the electroless plating catalyst applied thereto was immersed in an electroless nickel phosphorous plating solution (SE-666 produced by JAPAN KANIGEN CO., LTD.) for 15 minutes so as to grow an electroless nickel phosphorus plating film to on the surface of the molded product such that the electroless nickel phosphorus plating film had a thickness of 1 By the production method as explained above, a plated part of Experiment 2 was obtained. Note that the electroless nickel phosphorous plating solution used in Experiment 2 contains the reducing agent in a content amount greater than that of the electroless copper plating solution used in Experiment 1. Accordingly, even if the amount of the electroless plating catalyst (Pd) is small, the plating reaction easily progresses.

<Experiment 4>

In Experiment 4, a plated part was produced by a method similar to that in Experiment 1, except that Polymer B represented by the formula (6) was used as the polymer contained in the catalyst activity inhibiting layer.

(1) Molding of Resin Molded Product (Base Member)

A resin molded product (PPS) was molded by a method similar to that in Experiment 1.

(2) Formation of Catalyst Activity Inhibiting Layer

In Experiment 4, a catalyst activity inhibiting layer was formed on a surface of the base member by a method similar to that in Experiment 1, except that Polymer B represented by the formula (6) (poly(N-isopropyl acrylamide) (PNIPAM) produced by FUNAKOSHI CO., LTD.) was used, rather than Polymer A. The polymer B represented by the formula (6) is the polymer represented by the formula (3); in the formula (3), $R^4$ is a methyl group, and $R^5$ is an isopropyl group. The molecular weight of Polymer B was the weight average molecular weight (Mw)=40,000. The thickness of the formed catalyst activity inhibiting layer was measured by a method similar to that in Experiment 1. The thickness of the catalyst activity inhibiting layer was approximately 80 nm.

(3) Laser Drawing, Application of Electroless Plating Catalyst, and Electroless Plating The laser drawing, the application of electroless plating catalyst and the electroless plating were performed in this order for the molded product having the catalyst activity inhibiting layer formed thereon, by a method similar to that in Experiment 1. With this, an electroless copper plating film was grown on the surface of the base member such that the electroless copper plating film had a thickness of 1 μm. By the production method as explained above, a plated part of Experiment 4 was obtained.

<Experiment 5>

In Experiment 5, a plated part was produced by a method similar to that in Experiment 1, except that Polymer C represented by the formula (7) was used as the polymer contained in the catalyst activity inhibiting layer.

(1) Molding of Resin Molded Product (Base Member)

A resin molded product (PPS) was molded by a method similar to that in Experiment 1.

(2) Formation of Catalyst Activity Inhibiting Layer

In Experiment 5, a catalyst activity inhibiting layer was formed on a surface of the base member by a method similar to that in Experiment 1, except that Polymer C represented by the formula (7) (PNIPAM, amine terminated, produced by SIGMA-ALDRICH JAPAN CO. LLC.) was used, rather than Polymer A. The polymer C represented by the formula (7) is the polymer represented by the formula (3); in the formula (3), $R^4$ is a group represented by the formula (4), and $R^5$ is an isopropyl group. The molecular weight of Polymer C was the weight average molecular weight (Mw)=5,500. The thickness of the formed catalyst activity inhibiting layer was measured by a method similar to that in Experiment 1. The thickness of the catalyst activity inhibiting layer was approximately 80 nm.

(3) Laser Drawing, Application of Electroless Plating Catalyst, and Electroless Plating The laser drawing, the application of electroless plating catalyst and the electroless plating were performed in this order for the molded product having the catalyst activity inhibiting layer formed thereon, by a method similar to that in Experiment 1. With this, an electroless copper plating film was grown on the surface of the base member such that the electroless copper plating film had a thickness of 1 μm. By the production method as explained above, a plated part of Experiment 5 was obtained.

<Experiment 6>

In Experiment 6, a plated part was produced by a method similar to that in Experiment 1, except that the resin molded product (base member) was washed (cleaned) after the laser drawing.

(1) Molding of Resin Molded Product (Base Member), Formation of Catalyst Activity Inhibiting Layer, and Laser Drawing A resin molded product (PPS) was molded as the base member, a catalyst activity inhibiting layer containing Polymer A was formed on a surface of the base member, and the laser drawing was performed for the resin molded product having the catalyst activity inhibiting layer formed thereon, by a method similar to that in Experiment 1.

(2) Washing of Resin Molded Product (Base Member)

The resin molded product having the laser drawing performed thereon was immersed in a commercially available pretreatment agent for plating (CONDICLEAN MA produced by OKUNO CHEMICAL INDUSTRIES CO., LTD) at 60° C. for 15 minutes. Afterwards, the resin molded product was washed once with pure water (purified water) at 50° C. and then washed three times with pure water (purified water) at the room temperature. The resin molded product was used for the next step, without being air-dried after the washing.

(3) Application of Electroless Plating Catalyst and Electroless Plating

The application of electroless plating catalyst and the electroless plating were performed in this order for the molded product after the washing, by a method similar to that in Experiment 1. With this, an electroless copper plating film was grown on the surface of the base member such that the electroless copper plating film had a thickness of 1 μm. By the production method as explained above, a plated part of Experiment 6 was obtained.

<Experiment 7>

In Experiment 7, a plated part was produced by a method similar to that in Experiment 1, except that a $CO_2$ laser drawing apparatus was used in the laser drawing and that washing for the resin molded product (base member) was performed after the laser drawing.

At first, a resin molded product (PPS) as the base member was molded and a catalyst activity inhibiting layer containing Polymer A was formed on a surface of the base member, by a method similar to that in Experiment 1. Next, the laser drawing was performed for the resin molded product having the catalyst activity inhibiting layer formed thereon, by a method similar to that in Experiment 2. Then, the washing was performed for the resin molded product, by a method similar to that in Experiment 6. The application of electroless plating catalyst and the electroless plating were performed in this order for the molded product after the washing, by a method similar to that in Experiment 1. With this, an electroless copper plating film was grown on the surface of the base member such that the electroless copper plating film had a thickness of 1 μm. By the production method as explained above, a plated part of Experiment 7 was obtained.

<Experiment 8>

In Experiment 8, a plated part was produced by a method similar to that in Experiment 1, except that the washing was performed for a resin molded product (base member) after the laser drawing and that an electroless nickel phosphorous plating solution was used as the plating solution.

At first, a resin molded product (PPS) was molded, a catalyst activity inhibiting layer containing Polymer A was formed on a surface of the base member, and the laser drawing was performed therefor, by a method similar to that in Experiment 1. Next, the washing was performed for the resin molded product, in a method similar to that in Experiment 6. For the molded product after the washing, the application of electroless plating catalyst was performed by a method similar to that in Experiment 1, and the electroless nickel phosphorous plating was performed by a method similar to that in Experiment 3. With this, an electroless nickel phosphorous plating film was grown on the surface of the base member such that the electroless nickel phosphorus plating film had a thickness of 1 μm. By the production method as explained above, a plated part of Experiment 8 was obtained.

<Experiment 9>

In Experiment 9, a plated part was produced by a method similar to that in Experiment 1, except that Polymer B represented by the formula (6) was used as the polymer contained in the catalyst activity inhibiting layer, and that the washing was performed for a resin molded product (base member) after the laser drawing.

At first, a resin molded product (PPS) was molded by a method similar to that in Experiment 1, and then a catalyst activity inhibiting layer containing Polymer B was formed on a surface of the base member by a method similar to that in Experiment 4. Next, the laser drawing was performed for the resin molded product, having the catalyst activity inhibiting layer formed thereon, by a method similar to that in Experiment 1. Then, the washing was performed for the resin molded product, by a method similar to that in Experiment 6. For the molded product after the washing, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 9 was obtained.

<Experiment 10>

In Experiment 10, a plated part was produced by a method similar to that in Experiment 1, except that Polymer C represented by the formula (7) was used as the polymer contained in the catalyst activity inhibiting layer, and that the washing was performed for a resin molded product (base member) after the laser drawing.

At first, a resin molded product (PPS) was molded by a method similar to that in Experiment 1, and then a catalyst activity inhibiting layer containing Polymer C was formed on a surface of the base member by a method similar to that in Experiment 5. Next, the laser drawing was performed for the resin molded product having the catalyst activity inhibiting layer formed thereon, by a method similar to that in Experiment 1. Then, the washing was performed for the resin molded product, by a method similar to that in Experiment 6. For the molded product after the washing, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 10 was obtained.

<Experiment 11>

In Experiment 11, a plated part was produced by a method similar to that in Experiment 1, except that Polymer E represented by the formula (9) was used as the polymer contained in the catalyst activity inhibiting layer, and that the washing was performed for a resin molded product (base member) after the laser drawing.

(1) Molding of Resin Molded Product (Base Member)

A resin molded product (PPS) was molded by a method similar to that in Experiment 1.

(2) Formation of Catalyst Activity Inhibiting Layer

In Experiment 11, a catalyst activity inhibiting layer was formed on a surface of the base member by a method similar to that in Experiment 1, except that an amino-ethylated acrylic polymer represented by the formula (9) (Polymer E) (POLYMENT NK-350 produced by NIPPON SHOKUBAI CO., LTD.) was used, rather than Polymer A. The molecular weight of Polymer E was the weight average molecular weight (Mw)=100,000. The thickness of the formed catalyst activity inhibiting layer was measured by a method similar to that in Experiment 1. The thickness of the catalyst activity inhibiting layer was 80 nm.

(3) Laser Drawing, Washing of Resin Molded Product (Base Member), Application of Electroless Plating Catalyst, and Electroless Plating The laser drawing was performed for the molded product having the catalyst activity inhibiting layer formed thereon, by a method similar to that in Experiment 1, and then the washing of the resin molded product (base member) was performed by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 11 was obtained.

<Experiment 12>

In Experiment 12, a plated part was produced by a method similar to that in Experiment 1, except that Polymer B represented by the formula (6) was used as the polymer contained in the catalyst activity inhibiting layer, the $CO_2$ laser drawing apparatus was used in the laser drawing, and further that the washing was performed for a resin molded product (base member) after the laser drawing.

At first, a resin molded product (PPS) was molded by a method similar to that in Experiment 1. Next, Polymer B represented by the formula (6) was used to form a catalyst activity inhibiting layer on a surface of the base member by a method similar to that in Experiment 4. Then, the laser drawing was performed for the resin molded product having the catalyst activity inhibiting layer formed thereon, by a method similar to that in Experiment 2 with the use of the $CO_2$ laser drawing apparatus. Next, the washing was performed for the resin molded product (base member), by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 12 was obtained.

<Experiment 13>

In Experiment 13, a plated part was produced by a method similar to that in Experiment 1, except that Polymer C represented by the formula (7) was used as the polymer contained in the catalyst activity inhibiting layer, the $CO_2$ laser drawing apparatus was used in the laser drawing, and further that the washing was performed for a resin molded product (base member) after the laser drawing.

At first, a resin molded product (PPS) was molded by a method similar to that in Experiment 1. Next, Polymer C represented by the formula (7) was used to form a catalyst activity inhibiting layer on a surface of the base member by a method similar to that in Experiment 5. Then, the laser drawing was performed for the resin molded product having the catalyst activity inhibiting layer formed thereon, by a method similar to that in Experiment 2 with the use of the $CO_2$ laser drawing apparatus. Next, the washing was performed for the resin molded product (base member), by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 13 was obtained.

<Experiment 14>

In Experiment 14, a plated part was produced by a method similar to that in Experiment 1, except that Polymer E represented by the formula (9) was used as the polymer contained in the catalyst activity inhibiting layer, the $CO_2$ laser drawing apparatus was used in the laser drawing, and further that the washing was performed for a resin molded product (base member) after the laser drawing.

At first, a resin molded product (PPS) was molded by a method similar to that in Experiment 1. Next, Polymer E represented by the formula (9) was used to form a catalyst activity inhibiting layer on a surface of the base member by a method similar to that in Experiment 11. Then, the laser drawing was performed for the resin molded product having the catalyst activity inhibiting layer formed thereon, by a method similar to that in Experiment 2 with the use of the $CO_2$ laser drawing apparatus. Next, the washing was performed for the resin molded product (base member), by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 14 was obtained.

<Experiment 15>

In Experiment 15, a plated part was produced by a method similar to that in Experiment 1, except that Polymer B represented by the formula (6) was used as the polymer contained in the catalyst activity inhibiting layer, the washing was performed for a resin molded product (base member) after the laser drawing, and further that an electroless nickel phosphorous plating solution was used as the plating solution.

At first, a resin molded product (PPS) was molded by a method similar to that in Experiment 1. Next, Polymer B represented by the formula (6) was used to form a catalyst activity inhibiting layer on a surface of the base member, by a method similar to that in Experiment 4. Then, the laser drawing was performed for the resin molded product having the catalyst activity inhibiting layer formed thereon, by a method similar to that in Experiment 1. Next, the washing was performed for the resin molded product (base member), by a method similar to that in Experiment 6. For the base member after the washing, the application of electroless plating catalyst was performed by a method similar to that in Experiment 1, and then the electroless nickel phosphorous plating solution was used to thereby grow an electroless nickel phosphorous plating film on the surface of the molded product such that the electroless nickel phosphorous plating film had a thickness of 1 µm, by the method similar to that in Experiment 3. By the production method as explained above, a plated part of Experiment 15 was obtained.

<Experiment 16>

In Experiment 16, a plated part was produced by a method similar to that in Experiment 1, except that Polymer C represented by the formula (7) was used as the polymer contained in the catalyst activity inhibiting layer, the washing was performed for a resin molded product (base member) after the laser drawing, and further that an electroless nickel phosphorous plating solution was used as the plating solution.

At first, a resin molded product (PPS) was molded by a method similar to that in Experiment 1. Next, Polymer C represented by the formula (7) was used to form a catalyst activity inhibiting layer on a surface of the base member by a method similar to that in Experiment 5. Then, the laser drawing was performed for the resin molded product having the catalyst activity inhibiting layer formed thereon, by a method similar to that in Experiment 1. Next, the washing was performed for the resin molded product (base member), by a method similar to that in Experiment 6. For the molded product after the washing, the application of electroless plating catalyst was performed by a method similar to that in Experiment 1, and then the electroless nickel phosphorous plating solution was used to thereby grow an electroless nickel phosphorous plating film on the surface of the molded product such that the electroless nickel phosphorous plating film had a thickness of 1 µm, by the method similar to that in Experiment 3. By the production method as explained above, a plated part of Experiment 16 was obtained.

<Experiment 17>

In Experiment 17, a plated part was produced by a method similar to that in Experiment 1, except that Polymer E represented by the formula (9) was used as the polymer contained in the catalyst activity inhibiting layer, the washing was performed for a resin molded product (base member) after the laser drawing, and further that an electroless nickel phosphorous plating solution was used as the plating solution.

At first, a resin molded product (PPS) was molded by a method similar to that in Experiment 1. Next, Polymer E represented by the formula (9) was used to form a catalyst activity inhibiting layer on a surface of the base member by a method similar to that in Experiment 11. Then, the laser drawing was performed for the resin molded product having the catalyst activity inhibiting layer formed thereon, by a method similar to that in Experiment 1. Next, the washing was performed for the resin molded product (base member), by a method similar to that in Experiment 6. For the molded product after the washing, the application of electroless plating catalyst was performed by a method similar to that in Experiment 1, and then the electroless nickel phosphorous plating solution was used to thereby grow an electroless nickel phosphorous plating film on the surface of the molded product such that the electroless nickel phosphorous plating film had a thickness of by a method similar to that in Experiment 3. By the production method as explained above, a plated part of Experiment 17 was obtained.

<Experiment 18>

In Experiment 18, a plated part was produced by a method similar to that in Experiment 1, except that Polymer F represented by the formula (10) was used as the polymer contained in the catalyst activity inhibiting layer, and the washing was performed for a resin molded product (base member) after the laser drawing.

(1) Molding of Resin Molded Product (Base Member)

A resin molded product (PPS) was molded by a method similar to that in Experiment 1.

(2) Formation of Catalyst Activity Inhibiting Layer

In Experiment 18, a catalyst activity inhibiting layer was formed on a surface of the base member by a method similar to that in Experiment 1, except that polyamide-imide represented by the formula (10) (Polymer F) (produced by TORAY INDUSTRIES, INC.) was used, rather than Polymer A. The thickness of the formed catalyst activity inhibiting layer was measured by a method similar to that in Experiment 1. The thickness of the catalyst activity inhibiting layer was approximately 100 nm.

(3) Laser Drawing, Washing of Resin Molded Product (Base Member), Application of Electroless Plating Catalyst, and Electroless Plating The laser drawing was performed for the molded product having the catalyst activity inhibiting layer formed thereon, by a method similar to that in Experiment 1, and then the washing of the resin molded product (base member) was performed by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 18 was obtained.

<Experiment 19>

In Experiment 19, a plated part was produced by a method similar to that in Experiment 1, except that Polymer F represented by the formula (10) was used as the polymer contained in the catalyst activity inhibiting layer, the washing was performed for a resin molded product (base member) after the laser drawing, and further that an electroless nickel phosphorous plating solution was used as the plating solution.

At first, a resin molded product (PPS) was molded by a method similar to that in Experiment 1. Next, Polymer F represented by the formula (10) was used to form a catalyst activity inhibiting layer on a surface of the base member by a method similar to that in Experiment 18. Then, the laser drawing was performed for the resin molded product having the catalyst activity inhibiting layer formed thereon, by a method similar to that in Experiment 1. Next, the washing was performed for the resin molded product (base member), by a method similar to that in Experiment 6. For the base member after the washing, the application of electroless plating catalyst was performed by a method similar to that in Experiment 1, and then the electroless nickel phosphorous plating solution was used to grow an electroless nickel phosphorous plating film on the surface of the molded product such that the electroless nickel phosphorous plating film had a thickness of 1 µm, by the method similar to that in Experiment 3. By the production method as explained above, a plated part of Experiment 19 was obtained.

<Experiment 20>

In Experiment 20, a plated part was produced by a method similar to that in Experiment 1, except that polyamide molded into a plated shape as a base member was used, and the washing was performed for a resin molded product (base member) after the laser drawing.

(1) Molding of Resin Molded Product (Base Member)

In Experiment 20, a resin molded product was molded by a method similar to that in Experiment 1, except that polyamide (PA) (VYLOAMIDE produced by TOYOBO CO., LTD.), rather than using PPS.

(2) Formation of Catalyst Activity Inhibiting Layer, Laser Drawing, Washing of Resin Molded Product (Base Member), Application of Electroless Plating Catalyst, and Electroless Plating A catalyst activity inhibiting layer containing Polymer A was formed on a surface of the base member by a method similar to that in Experiment 1. The laser drawing was performed for the molded product having the catalyst activity inhibiting layer formed thereon, by a method similar to that in Experiment 1, and then the washing of the resin molded product (base member) was performed by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 20 was obtained.

<Experiment 21>

In Experiment 21, a plated part was produced by a method similar to that in Experiment 1, except that polyamide molded into a plated shape as a base member was used, and the washing was performed for a resin molded product (base member) after the laser drawing, and further that an electroless nickel phosphorous plating solution was used as the plating solution.

At first, a resin molded product (PA) was molded by a method similar to that in Experiment 20. Next, a catalyst activity inhibiting layer containing Polymer A was formed on a surface of the base member by a method similar to that in Experiment 1. The laser drawing was performed for the molded product having the catalyst activity inhibiting layer formed thereon, by a method similar to that in Experiment 1. Then, the washing of the resin molded product (base member) was performed by a method similar to that in Experiment 6. For the molded product after the washing, the application of electroless plating catalyst was performed by a method similar to that in Experiment 1; and then the electroless nickel phosphorous plating solution was used to thereby grow an electroless nickel phosphorous plating film on the surface of the molded product such that the electroless nickel phosphorous plating film had a thickness of 1 µm, by a method similar to that in Experiment 3. By the production method as explained above, a plated part of Experiment 21 was obtained.

<Experiment 22>

In Experiment 22, a plated part was produced by a method similar to that in Experiment 1, except that polyamide molded into a plated shape as a base member was used, and the washing was performed for a resin molded product (base member) after the laser drawing.

(1) Molding of Resin Molded Product (Base Member)

In Experiment 22, a resin molded product was molded by a method similar to that in Experiment 1, except that polyamide (PA) (AMODEL AS-1566HS produced by SOLVAY JAPAN, LTD.), rather than using PPS.

(2) Formation of Catalyst Activity Inhibiting Layer, Laser Drawing, Washing of Resin Molded Product (Base Member), Application of Electroless Plating Catalyst, and Electroless Plating A catalyst activity inhibiting layer containing Polymer A was formed on a surface of the base member by a method similar to that in Experiment 1. The laser drawing was performed for the molded product having the catalyst activity inhibiting layer formed thereon, by a method similar to that in Experiment 1, and then the washing of the resin molded product (base member) was performed by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 µm. By the production method as explained above, a plated part of Experiment 22 was obtained.

<Experiment 23>

In Experiment 23, a plated part was produced by a method similar to that in Experiment 1, except that polyamide molded into a plated shape as a base member was used, and the washing was performed for a resin molded product (base member) after the laser drawing, and further that an electroless nickel phosphorous plating solution was used as the plating solution.

At first, a resin molded product (PA) was molded by a method similar to that in Experiment 22. Next, a catalyst activity inhibiting layer containing Polymer A was formed on a surface of the base member by a method similar to that in Experiment 1. The laser drawing was performed for the resin molded product having the catalyst activity inhibiting layer formed thereon, by a method similar to that in Experiment 1. Next, the washing was performed for the resin molded product (base member), by a method similar to that in Experiment 6. For the molded product after the washing, the application of electroless plating catalyst was performed by a method similar to that in Experiment 1, and then the electroless nickel phosphorous plating solution was used to thereby grow an electroless nickel phosphorous plating film on the surface of the molded product such that the electroless nickel phosphorous plating film had a thickness of 1 μm, by the production method similar to that in Experiment 3. By the method as explained above, a plated part of Experiment 23 was obtained.

<Experiment 24>

In Experiment 24, a plated part was produced by a method similar to that in Experiment 1, except that a resin layer containing Polymer D represented by the formula (8), rather than the catalyst activity inhibiting layer, was formed on a base member, and that the washing was performed for a resin molded product (base member) after the laser drawing.

(1) Molding of Resin Molded Product (Base Member)

A resin molded product (PPS) was molded by a method similar to that in Experiment 1.

(2) Formation of Resin Layer

In Experiment 24, a resin layer was formed on a surface of the base member by a method similar to that in Experiment 1, except that a hyper-branched polymer (HYPERTECH HPS-200 produced by NISSAN CHEMICAL CORPORATION) was used, rather than Polymer A. The molecular weight of Polymer D was the weight average molecular weight (Mw)=23,000. The thickness of the formed resin layer was measured by a method similar to that in Experiment 1. The thickness of the resin layer was 80 nm.

(3) Laser Drawing, Washing of Resin Molded Product (Base Member), Application of Electroless Plating Catalyst, and Electroless Plating The laser drawing was performed for the molded product having the resin layer formed thereon, by a method similar to that in Experiment 1, and then the washing of the resin molded product (base member) was performed by a method similar to that in Experiment 6. For the washed base member, the application of electroless plating catalyst and the electroless plating were performed in this order by a method similar to that in Experiment 1. With this, an electroless copper plating film was grown on the surface of the base member such that the electroless copper plating film had a thickness of 1 μm. By the production method as explained above, a plated part of Experiment 24 was obtained.

<Experiment 25>

In Experiment 25, a plated part was produced by a method similar to that in Experiment 1, except that a resin layer containing Polymer D represented by the formula (8), rather than the catalyst activity inhibiting layer, was formed on a base member, that a $CO_2$ laser drawing apparatus was used in the laser drawing, and further that washing for the resin molded product (base member) was performed after the laser drawing.

At first, a resin molded product (PPS) was molded by a method similar to that in Experiment 1. Next, Polymer D represented by the formula (8) was used to form a resin layer on a surface of the base member, by a method similar to that in Experiment 24. The laser drawing was performed for the resin molded product having the resin layer formed thereon, by a method similar to that in Experiment 2 with the use of the $CO_2$ laser drawing apparatus. Then, the washing was performed for the resin molded product (base member), by a method similar to that in Experiment 6. The application of electroless plating catalyst and the electroless plating were performed in this order for the base member after the washing, by a method similar to that in Experiment 1. With this, an electroless copper plating film was grown on the surface of the base member such that the electroless copper plating film had a thickness of 1 μm. By the production method as explained above, a plated part of Experiment 25 was obtained.

<Experiment 26>

In Experiment 26, a plated part was produced by a method similar to that in Experiment 1, except that a resin layer containing Polymer D represented by the formula (8), rather than the catalyst activity inhibiting layer, was formed on a base member, that washing for the resin molded product (base member) was performed after the laser drawing, and further that an electroless nickel phosphorous plating solution was used as the plating solution.

At first, a resin molded product (PPS) was molded by a method similar to that in Experiment 1. Next, Polymer D represented by the formula (8) was used to form a resin layer on a surface of the base member, by a method similar to that in Experiment 24. The laser drawing was performed for the resin molded product having the resin layer formed thereon, by a method similar to that in Experiment 1. Next, the washing was performed for the resin molded product (base member), by a method similar to that in Experiment 6. The application of electroless plating catalyst was performed for the molded product after the washing, by a method similar to that in Experiment 1, and then the electroless nickel phosphorous plating solution was used to thereby grow an electroless nickel phosphorous plating film on the surface of the molded product such that the electroless nickel phosphorous plating film had a thickness of 1 μm, by the method similar to that in Experiment 3. By the production method as explained above, a plated part of Experiment 26 was obtained.

<Polymer A>

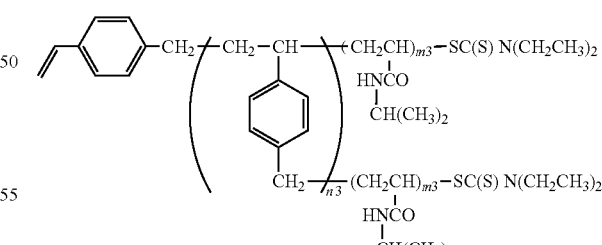

(5)

<Polymer B>

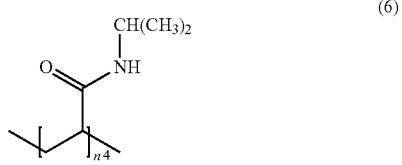

(6)

-continued

<Polymer C>

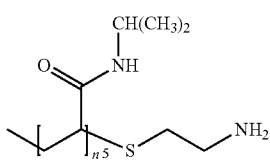
(7)

<Polymer D>

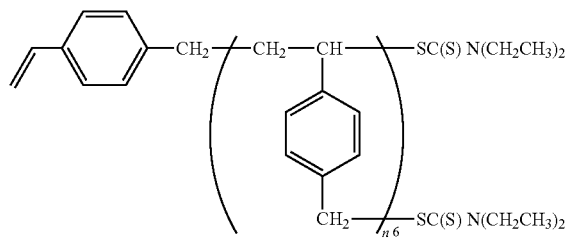
(8)

<Polymer E>

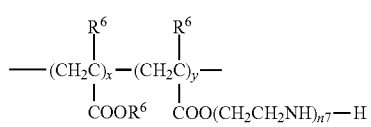
(9)

<Polymer F>

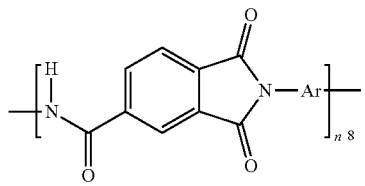
(10)

<Evaluation>

The plated parts produced in Experiments 1 to 26, respectively, as explained above were visually observed, and the plating precipitation property and the plating selectivity were evaluated. The results of the evaluation are indicated in TABLE 1.

<Criterion for Evaluation of Plating Precipitation Property>

+: The plating film is grown in a laser drawing portion.

−: The plating film is not grown in a laser drawing portion.

<Criterion for Evaluation of Plating Selectivity>

+: The plating film is grown only in a laser drawing portion.

±: The plating film is grown partially also in a portion different from the laser drawing portion.

−: The plating film is grown in the entirety of the base material.

TABLE 1

|  | Material and Production Method | | | | | Results of Evaluation | |
|---|---|---|---|---|---|---|---|
|  |  |  |  |  |  | Plating |  |
| Experiment | Base member | Polymer | Laser | Washing of base member | Electroless plating | precipitation property | Plating selectivity |
| 1 | PPS | Polymer A | $YVO_4$ | none | Electroless Cu plating | + | ± |
| 2 | PPS | Polymer A | $CO_2$ | none | Electroless Cu plating | + | ± |
| 3 | PPS | Polymer A | $YVO_4$ | none | Electroless NiP plating | + | ± |
| 4 | PPS | Polymer B | $YVO_4$ | none | Electroless Cu plating | + | ± |
| 5 | PPS | Polymer C | $YVO_4$ | none | Electroless Cu plating | + | ± |
| 6 | PPS | Polymer A | $YVO_4$ | yes | Electroless Cu plating | + | + |
| 7 | PPS | Polymer A | $CO_2$ | yes | Electroless Cu plating | + | + |
| 8 | PPS | Polymer A | $YVO_4$ | yes | Electroless NiP plating | + | + |
| 9 | PPS | Polymer B | $YVO_4$ | yes | Electroless Cu plating | + | + |
| 10 | PPS | Polymer C | $YVO_4$ | yes | Electroless Cu plating | + | + |
| 11 | PPS | Polymer E | $YVO_4$ | yes | Electroless Cu plating | + | ± |
| 12 | PPS | Polymer B | $CO_2$ | yes | Electroless Cu plating | + | + |
| 13 | PPS | Polymer C | $CO_2$ | yes | Electroless Cu plating | + | + |
| 14 | PPS | Polymer E | $CO_2$ | yes | Electroless Cu plating | + | ± |
| 15 | PPS | Polymer B | $YVO_4$ | yes | Electroless NiP plating | + | − |
| 16 | PPS | Polymer C | $YVO_4$ | yes | Electroless NiP plating | + | − |
| 17 | PPS | Polymer E | $YVO_4$ | yes | Electroless NiP plating | + | − |
| 18 | PPS | Polymer F | $YVO_4$ | yes | Electroless Cu plating | + | ± |
| 19 | PPS | Polymer F | $YVO_4$ | yes | Electroless NiP plating | + | − |
| 20 | PA | Polymer A | $YVO_4$ | yes | Electroless Cu plating | + | + |
| 21 | PA | Polymer A | $YVO_4$ | yes | Electroless NiP plating | + | + |
| 22 | PA | Polymer A | $YVO_4$ | yes | Electroless Cu plating | + | + |
| 23 | PA | Polymer A | $YVO_4$ | yes | Electroless NiP plating | + | + |
| 24 | PPS | Polymer D | $YVO_4$ | yes | Electroless Cu plating | + | − |
| 25 | PPS | Polymer D | $CO_2$ | yes | Electroless Cu plating | + | − |
| 26 | PPS | Polymer D | $YVO_4$ | yes | Electroless NiP plating | + | − |

(1) Regarding Experiments 6 to 19 and 24 to 26

In all of Experiments 6 to 19 and 24 to 26, the polyphenylene sulfide (PPS) was used for forming the base member, and the washing of the substrate (base member) was performed after the irradiation with the laser beam. With respect to the six kinds of polymers which are: Polymer A used in Experiments 6 to 8, Polymer B used in Experiments 9, 12 and 15, Polymer C used in Experiments 10, 13 and 16, Polymer D used in Experiments 24 to 26, Polymer E used in Experiments 11, 14 and 17, and Polymer F used in Experiments 18 and 19 were subjected to the overall evaluation based on the results of evaluation of the plating selectivity indicated in TABLE 1, in accordance with the following criterion for the overall evaluation. The results of the overall evaluation are indicated in TABLE 2.

<Criterion for Overall Evaluation>

++: The plating selectivity of electroless copper plating and the plating selectivity of electroless nickel phosphorous plating were both "+".

+: Although the plating selectivity of electroless copper plating was "+", the plating selectivity of electroless nickel phosphorous plating was "−".

±: Although the plating selectivity of electroless copper plating was "±", the plating selectivity of electroless nickel phosphorous plating was "−".

−: The plating selectivity of electroless copper plating and the plating selectivity of electroless nickel phosphorous plating were both "−".

TABLE 2

|  |  |  | Results of Evaluation | | |
|---|---|---|---|---|---|
|  |  |  | Plating Selectivity | | Overall |
|  | Experiment No. | Polymer | Electroless Cu plating | Electroless NiP plating | Evaluation |
| Examples | Experiments 6 to 8 | Polymer A | + | + | ++ |
|  | Experiments 9, 12, 15 | Polymer B | + | − | + |
|  | Experiments 10, 13, 16 | Polymer C | + | − | + |
|  | Experiments 11, 14, 17 | Polymer E | ± | − | ± |
|  | Experiments 18, 19 | Polymer F | ± | − | ± |
| Comparative Example | Experiments 24 to 26 | Polymer D | − | − | − |

As indicated in TABLE 1 and TABLE 2, the plated parts each produced by using one of Polymers A to C, E and F having at least one of amide group and amino group were satisfactory in both of the plating precipitation property and the plating selectivity of the electroless copper plating (overall evaluation: ++, +, ±). It is presumed that, in the laser drawing portion, the electroless copper plating film was grown since the catalyst activity inhibiting layer was removed; whereas in a portion different from the laser drawing portion, the growth of the electroless copper plating was inhibited (suppressed) due to the presence of the catalyst activity inhibiting layer. From the results, it was appreciated that Polymers A to C, E and F function as the catalyst activity inhibiting agent. It is presumed that the amide group and/or amino group contained in Polymers A to C, E and F inhibited the catalytic activity of the electroless plating catalyst.

Among these plated parts, the plated parts produced by using Polymers A to C each of which is the branched polymer having the amide group in the side chain were particularly satisfactory in the plating selectivity of the electroless copper plating (the result of overall evaluation: ++ or +) as compared with the plated parts produced by using Polymers E and F. Polymer E is a branched polymer having the amino group, and Polymer F is a polymer having the amide group in the straight chain. From this result, it is assumed that Polymers A to C each of which is the branched polymer having the amide group in the side chain is highly effective in inhibiting the catalytic activity of the electroless plating catalyst.

Further, the plated parts produced by using Polymer A which is the hyper-branched polymer also had an excellent plating selectivity of the electroless nickel phosphorous plating, in addition to that of the electroless copper plating (result of the overall evaluation: ++). The electroless nickel phosphorous plating solution contains the reducing agent in the content amount greater than that of the electroless copper plating solution. Accordingly, the electroless plating reaction easily progresses in the electroless nickel phosphorous plating, as compared with the electroless copper plating. Also in such an electroless nickel phosphorous plating, Polymer A functioned sufficiently as the catalyst activity inhibiting agent which inhibits the catalytic activity of the electroless plating catalyst. The reason for this is presumed as follows. Namely, since Polymer A has many side chains which are highly flexible, Polymer A is easily adsorbed to palladium (Pd) as the electroless plating catalyst and functions as the polydentate ligand, thereby forming a firm chelate structure with the electroless plating catalyst (palladium ion). With this, also in the electroless nickel phosphorous plating solution containing the large amount of the reducing agent, the reduction of the palladium ion is suppressed (inhibited), which results in the suppression (inhibition) of the formation of electroless plating film.

On the other hand, in the plating parts produced by using Polymer D, the plating film was grown in the entirety of the base member both in the cases of the electroless copper plating and the electroless nickel phosphorus plating, and was not capable of selectively forming the plating film (plating precipitation property: +, plating selectivity: −, overall evaluation: −). From this result, it is appreciated that Polymer D does not function as the catalytic activity inhibiting agent. Polymer D is the hyper-branched polymer having a group containing sulfur (dithiocarbamate group). The dithiocarbamate group is considered as having a tendency to adsorb the electroless plating catalyst thereto. However, it is presumed that since Polymer D which does not have the amide group and/or the amino group cannot trap the electroless plating catalyst firmly, Polymer D did not function as the catalytic activity inhibiting agent.

(2) Regarding Experiments 1 to 5

Experiments 1 to 5 were conducted under conditions similar to those of Experiments 6 to 10, respectively, except that the washing of the substrate (base member) was not performed after the irradiation with laser beam. The results of evaluation of plating selectivity in Experiments 1 to 5 are inferior, to some extent, to the results of evaluation of plating selectivity in Experiments 6 to 10. From this result, it is presumed that the plating selectivity is improved by the washing of the substrate (base member) which is performed after the irradiation with laser beam.

(3) Regarding Experiments 20 to 23

Experiments 20 to 22 were conducted under conditions similar to those of Experiment 6, except that the resin molded product of polyamide was used; Experiments 21 and 23 were conducted under conditions similar to those of Experiment 8, except that the resin molded product of polyamide was used. The result of evaluation of the plating selectivity in Experiments 20 to 23 were excellent similarly to the result of evaluation of the plating selectivity in Experiments 6 and 8. From this result, it was confirmed that the selective plating can be realized also by using the resin molded product of polyamide.

According to the method of producing plating part of the present teaching, it is possible to form a plating film only in a predefined pattern, while suppressing any formation of the plating film in a part or portion (location) different from the predefined pattern, by a simple producing process with respect to base members of a variety of kinds of materials. Accordingly, the present teaching is applicable to production of an electric part having an electric circuit, a three-dimensional circuit (Molded Interconnect Device: MID), etc.

What is claimed is:

1. A method for producing a plated part, comprising:
   forming, on a surface of a base member, a catalyst activity inhibiting layer containing a dendritic polymer which has an aromatic ring and at least one of an amide group and an amino group, wherein the dendritic polymer has a group containing sulfur;
   irradiating with light or heating a part of the surface of the base member on which the catalyst activity inhibiting layer is formed;
   applying an electroless plating catalyst to the surface of the base member heated or irradiated with the light; and
   bringing an electroless plating solution into contact with the surface of the base member to which the electroless plating catalyst is applied, to form an electroless plating film at a light-irradiated portion or a heated portion of the surface.

2. The method for producing the plated part according to claim 1, further comprising washing the surface of the base member after the part of the surface of the base member is heated or irradiated with the light and before the electroless plating solution is brought into contact with the surface of the base member.

3. The method for producing the plated part according to claim 1, wherein an inhibiting layer-removed portion from which the catalyst activity inhibiting layer is removed and an inhibiting layer-remaining portion in which the catalyst activity inhibiting layer remains are formed on the base member by the irradiating with the light or the heating the part of the surface of the base member, and
   the electroless plating film is formed at the inhibiting layer-removed portion.

4. The method for producing the plated part according to claim 1, wherein the dendritic polymer is a hyper-branched polymer.

5. The method for producing the plated part according to claim 1, wherein the dendritic polymer has a number average molecular weight of 3,000 to 30,000 and has a weight average molecular weight of 10,000 to 300,000.

6. The method for producing the plated part according to claim 1, wherein the group containing sulfur is a sulfide group or a dithiocarbamate group.

7. A method for producing a plated part, comprising:
   forming, on a surface of a base member, a catalyst activity inhibiting layer containing a dendritic polymer which has an aromatic ring and at least one of an amide group and an amino group wherein the dendritic polymer is represented by the following formula (1),

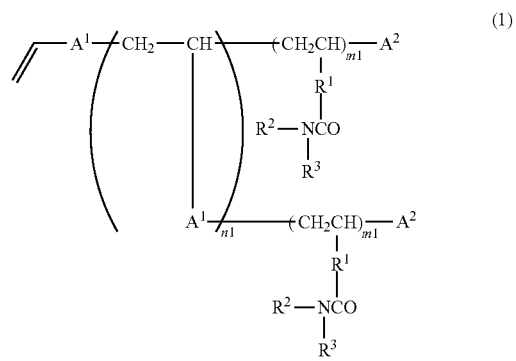

in the formula (1),
   $A^1$ is a group containing an aromatic ring, $A^2$ is a group containing sulfur or an amino group,
   $R^1$ is a single bond or a substituted or unsubstituted alkylene group having 1 to 5 carbon atoms, each of $R^2$ and $R^3$ is hydrogen or a substituted or unsubstituted alkyl group having 1 to 10 carbon atoms, and
   m1 is in a range of 1 to 10, and n1 is in a range of 5 to 100;
   irradiating with light or heating a part of the surface of the base member on which the catalyst activity inhibiting layer is formed;
   applying an electroless plating catalyst to the surface of the base member heated or irradiated with the light; and
   bringing an electroless plating solution into contact with the surface of the base member to which the electroless plating catalyst is applied, to form an electroless plating film at a light-irradiated portion or a heated portion of the surface.

8. The method for producing the plated part according to claim 7, wherein the dendritic polymer is represented by the formula (1), and wherein in the formula (1), $A^1$ is a group represented by the following formula (2):

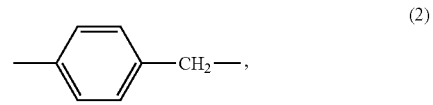

$A^2$ is a dithiocarbamate group, $R^1$ is a single bond, $R^2$ is hydrogen, and $R^3$ is an isopropyl group.

9. The method for producing the plated part according to claim 7, further comprising washing the surface of the base member after the part of the surface of the base member is heated or irradiated with the light and before the electroless plating solution is brought into contact with the surface of the base member.

10. The method for producing the plated part according to claim 7, wherein an inhibiting layer-removed portion from which the catalyst activity inhibiting layer is removed and an inhibiting layer-remaining portion in which the catalyst activity inhibiting layer remains are formed on the base member by the irradiating with the light or the heating the part of the surface of the base member, and
   the electroless plating film is formed at the inhibiting layer-removed portion.

11. The method for producing the plated part according to claim 7, wherein the dendritic polymer is a hyper-branched polymer.

12. The method for producing the plated part according to claim 7, wherein the dendritic polymer has a number average molecular weight of 3,000 to 30,000 and has a weight average molecular weight of 10,000 to 300,000.

* * * * *